(12) United States Patent
Mukherjee et al.

(10) Patent No.: US 7,487,419 B2
(45) Date of Patent: Feb. 3, 2009

(54) REDUCED-PIN-COUNT-TESTING ARCHITECTURES FOR APPLYING TEST PATTERNS

(76) Inventors: Nilanjan Mukherjee, 298028 SW. Flynn St., Wilsonville, OR (US) 97070; Jay Jahangiri, 6704 SE. 21st Ave., Portland, OR (US) 97202; Ronald Press, 10720 SW. Willow St., Tualatin, OR (US) 97062; Wu-Tung Cheng, 19030 SW. 35th Pl., Lake Oswego, OR (US) 97034

( * ) Notice: Subject to any disclaimer, the term of this patent is extended or adjusted under 35 U.S.C. 154(b) by 401 days.

(21) Appl. No.: 11/305,849

(22) Filed: Dec. 16, 2005

(65) Prior Publication Data

US 2007/0011542 A1    Jan. 11, 2007

Related U.S. Application Data

(60) Provisional application No. 60/690,999, filed on Jun. 15, 2005.

(51) Int. Cl.
*G01R 31/28* (2006.01)

(52) U.S. Cl. .................. 714/729; 714/726; 714/727; 714/25; 714/30; 714/718; 714/724; 714/732; 714/738; 714/739; 714/741

(58) Field of Classification Search ............ None
See application file for complete search history.

(56) References Cited

U.S. PATENT DOCUMENTS

| | | | |
|---|---|---|---|
| 4,879,717 A | | 11/1989 | Sauerwald et al. |
| 5,561,614 A | * | 10/1996 | Revilla et al. ............ 702/120 |
| 5,623,503 A | * | 4/1997 | Rutkowski ................ 714/727 |
| 5,717,702 A | | 2/1998 | Stokes et al. |
| 5,872,793 A | | 2/1999 | Attaway et al. |
| 6,260,165 B1 | * | 7/2001 | Whetsel .................... 714/727 |

(Continued)

OTHER PUBLICATIONS

Jahangiri, "Reduced Pin Count Testing Using an IEEE-Standard Environment," 4 pp. (available at 2003 Mentor Graphics Users Group International Conference, Apr. 28-30, 2003 and on Mentor Graphics' User Group website on Nov. 11, 2004).*

(Continued)

*Primary Examiner*—John P Trimmings
(74) *Attorney, Agent, or Firm*—Klarquist Sparkman, LLP

(57) ABSTRACT

Methods, apparatus, and systems for testing integrated circuits using one or more boundary scan cells are disclosed. The methods, apparatus, and systems can be used, for example, to apply at-speed test patterns through one or more boundary scan cells. For instance, in one exemplary nonlimiting embodiment, a circuit is disclosed comprising one or more boundary scan cells coupled to primary input ports or primary output ports of a circuit-under-test. The circuit further includes a boundary scan cell controller configured to apply test control signals to the one or more boundary scan cells. In this embodiment, the controller is configured to operate in a mode of operation whereby the controller applies test control signals to the one or more boundary scan cells that correspond to test control signals used to control one or more internal scan chains of the circuit-under-test during testing. The control signals of this exemplary embodiment include an at-speed-clock signal generated outside of the boundary scan cell controller.

47 Claims, 10 Drawing Sheets

U.S. PATENT DOCUMENTS

| | | | |
|---|---|---|---|
| 6,286,119 | B1 | 9/2001 | Wu et al. |
| 6,442,721 | B2* | 8/2002 | Whetsel ............... 714/726 |
| 6,516,432 | B1* | 2/2003 | Motika et al. .......... 714/732 |
| 6,557,129 | B1* | 4/2003 | Rajski et al. ........... 714/729 |
| 6,594,789 | B2* | 7/2003 | Whetsel ............... 714/727 |
| 6,862,705 | B1* | 3/2005 | Nesbitt et al. .......... 714/729 |
| 6,966,021 | B2* | 11/2005 | Rajski et al. ........... 714/726 |
| 7,281,183 | B2* | 10/2007 | Whetsel ............... 714/727 |
| 7,322,000 | B2* | 1/2008 | Colunga et al. ........ 714/727 |
| 2002/0184582 | A1* | 12/2002 | Pouya et al. ........... 714/726 |
| 2003/0110457 | A1 | 6/2003 | Nadeau-Dostie et al. |
| 2004/0117703 | A1 | 6/2004 | Mitra et al. |
| 2004/0177299 | A1 | 9/2004 | Wang et al. |
| 2005/0081130 | A1 | 4/2005 | Rinderknecht et al. |
| 2005/0097413 | A1 | 5/2005 | Ravi et al. |
| 2007/0294606 | A1* | 12/2007 | Whetsel ............... 714/727 |

OTHER PUBLICATIONS

Jahangiri, "Reduced pin-count test," 2003 Mentor Graphics Users Group International Conference, 20 pp. (slides shown Apr. 28-30, 2003, and available on Mentor Graphics' User Group website on Nov. 11, 2004).*

Jas et al., "Scan Vector Compression/Decompression Using Statistical Coding;" 7 pp. (also published as Jas et al., "Scan Vector Compression/Decompression Using Statistical Coding," IEEE VLSI Test Symp~ pp. 114-120 (1999)).*

Chandra et al., "Test Data Compression for System-on-a-Chip Using Golomb Codes," 8 pp. (also published as Chandra et al., "Test Data Compression for System-on-a-Chip Using Golomb Codes," 1EEE VLSI Test Symp., pp. 113-120 (2000)).*

Koenemann et al., "A SmartBIST Variant with Guaranteed Encoding," IEEE, pp. 325-330 (2001).*

Lin et al., "High-Frequency, At-Speed Scan Testing," IEEE Design & Test of Computers, pp. 17-25 (2003).*

Mentor Graphics, "BSDArchitect, Boundary Scan Generation and Verification," 2 pp. (2003).*

Mitra et al., "X-Compact: An Efficient Response Compaction Technique for Test Cost Reduction," IEEE ITC, pp. 311-320 (2002).*

Rajski et al., "Embedded Deterministic Test," IEEE Trans. on Computer-AidedDesign, vol. 23, No. 5, pp. 776-792 (May 2004).*

Swanson et al., "At-speed testing made easy," downloaded fromhttp://www.eedesign.com/article/printableArticle.jhtml?articleID=21401421, 7 pp. (document marked Jun. 3, 2004).*

Bassett et al., "Low Cost Testing of High Density Logic Components," *IEEE ITC*, pp. 550-557 (1989).

Evans, "Applications of Semiconductor Test Economics, and Multisite Testing to Lower Cost of Test," *IEEE ITC*, pp. 113-123 (1999).

Gillis et al., "Delay Test of Chip I/Os Using LSSD Boundary Scan," *IEEE ITC*, pp. 83-90 (1998).

Goel et al., "Optimisation of on-chip design-for-test infrastructure for maximal multi-site test throughput," *IEE Proc.-Comput. Digit. Tech.*, vol. 152, No. 3, pp. 442-456 (May 2005).

Jahangiri et al., "Achieving High Test Quality with Reduced Pin Count Testing," 6 pp. (also published as Jahangiri et al., "Achieving High Test Quality with Reduced Pin Count Testing," *Proc. 14th Asian Test Symp.*, pp. 312-317 (Dec. 2005)).

Jahangiri, "Reduced pin-count test," *Test & Measurement World*, 6 pp. (document marked Mar. 1, 2005).

Koenemann et al., "A SmartBIST Variant with Guaranteed Encoding," *IEEE*, pp. 325-330 (2001).

Lin et al., "High-Frequency, At-Speed Scan Testing," *IEEE Design & Test of Computers*, pp. 17-25 (2003).

Rajski et al., "Embedded Deterministic Test," *IEEE Trans. on Computer-Aided Design*, vol. 23, No. 5, pp. 776-792 (May 2004).

Rajski et al., "Finite Memory Test Response Compactors for Embedded Test Applications," *IEEE Trans. on Computer-Aided Design*, vol. 24, No. 4, pp. 622-634 (Apr. 2005).

Swanson et al., "At-speed testing made easy," downloaded from http://www.eedesign.com/article/printableArticle.jhtml?articleID=21401421, 7 pp. (document marked Jun. 3, 2004).

Synopsys, Inc., "Boundary Scan Cell BC_1," 6 pp. (document marked Sep. 12, 2005).

Synopsys, Inc., "Boundary Scan Cell Type BC_7," 6 pp. (document marked Sep. 12, 2005).

Tang et al., "On Reducing Test Data Volume and Test Application Time for Multiple Scan Chain Designs," *IEEE ITC*, pp. 1079-1088 (2003).

Volkerink et al., "Test Economics for Multi-site Test with Modern Cost Reduction Techniques," *IEEE VLSI Test Symp.*, 6 pp. (2002).

Vranken et al., "Enhanced Reduced Pin-Count Test for Full-Scan Design," *IEEE ITC*, pp. 738-747 (2001).

International Search Report and Written Opinion, PCT App. PCT/US2006/023360, 8 pages (May 29, 2008).

* cited by examiner

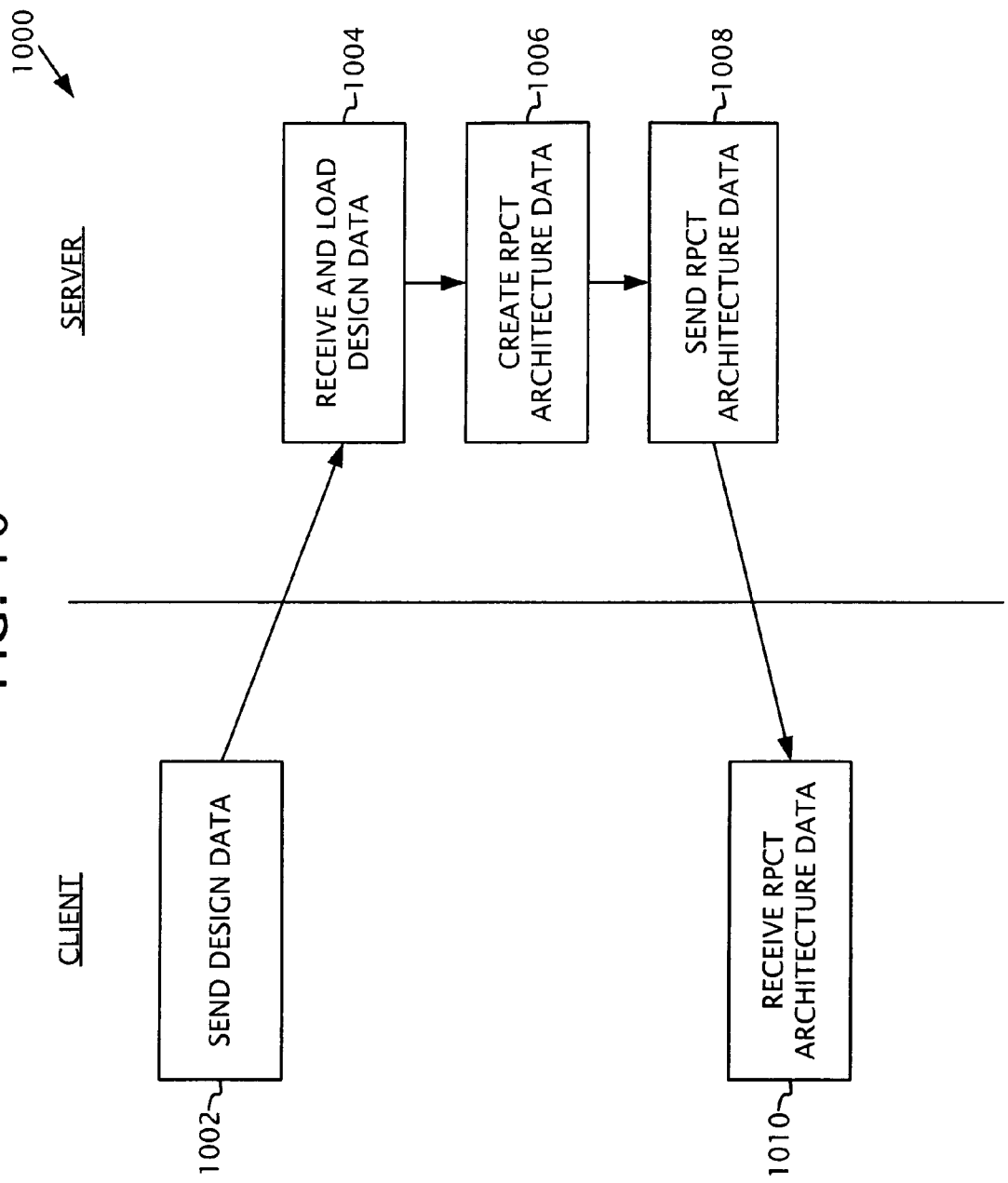

REDUCED-PIN-COUNT-TESTING ARCHITECTURES FOR APPLYING TEST PATTERNS

CROSS-REFERENCE TO RELATED APPLICATIONS

This application claims the benefit of U.S. Provisional Patent Application No. 60/690,999 filed Jun. 15, 2005, which is hereby incorporated herein by reference.

FIELD

This application relates to testing circuits, such as integrated circuits, and the testing hardware used in such testing.

BACKGROUND

The cost of manufacturing tests for integrated circuits ("ICs") has been growing significantly in the past decade. Some of the contributing factors include the increasing complexity of the circuits, shrinking line widths, shrinking line separations, and the increased popularity of new packaging technologies (for example, systems-in-a-package ("SIPs")). These factors have in part resulted in tens of millions of gates being integrated onto a single integrated circuit that supports a wide range of functionality. In addition, stringent quality requirements, newer technology nodes, and narrower time-to-market windows increase the cost and effort needed to test manufactured integrated circuits. The quality of test is often improved by employing advanced fault models (such as transition, path-delay, multiple-detect, bridging, or other such fault models) that are designed to catch additional defects missed by the conventional stuck-at fault model. Unfortunately, these fault models typically require complex test sets that are much bigger in size when compared to conventional stuck-at pattern test sets. The growing circuit size and the desired support for advanced fault models increase the test data volume that is stored inside an external tester (e.g., automated test equipment ("ATE")) as well as the test application time, which is proportional to the volume of test data shifted into the circuit during testing.

Another factor contributing to the test cost equation is the cost of the ATE equipment itself. The cost of an ATE is generally proportional to the number of pins it can support, its operating frequency, the pin electronics, the memory per pin, and other such factors. As the operating frequency of integrated circuits increase, packages become more complex and the demand for scan memory continues to rise. Thus, the infrastructure cost to support testing increases exponentially, often affecting the bottom line of a product. This has caused many companies to evaluate whether full-bandwidth, at-speed functional testing can be reduced (or replaced) by low-pin-requirement, slower-speed, structural testing. In such cases, the ATE is able to perform structural testing effectively but has been incapable of performing functional testing. Therefore, DFT is typically incorporated into the device such that one can get high fault coverage for structural testing and gain enough confidence about test quality such that functional tests can be reduced.

Several DFT techniques have been proposed to address the issue of rising test costs. Test data compression is one of the foremost techniques that help reduce test cost by decreasing the test data volume and test application time. Compression techniques store compressed patterns in the ATE memory, which are typically decompressed on-chip using some hardware before shifting the decompressed data into scan chains of the circuit-under-test. Similarly, at the output side, the test responses are typically compressed before sending them back to the ATE for determining failures. Among the different compaction schemes that can be used are selective compactors, convolutional compactors, X-compact, and MISRs. See, e.g., Rajski J., et al., "Embedded Deterministic Test," *IEEE Trans. on CAD*, vol. 23, pp. 776-792 (2004); Rajski J., et al., "Convolutional Compaction of Test Responses," *Proc. of ITC*, pp. 1079-1088 (2003); Koenemann B., "A SmartBIST Variant with Guaranteed Encoding," *Proc. of ATS*, pp. 325-330 (2001); and Mitra S., et al., "X-Compact: An Efficient Response Compaction Technique for Test Cost Reuction," *Proc. of ITC*, pp. 311-320 (2002). These exemplary schemes are each capable of compressing the test data to a different extent before sending it back to the ATE. The test application time can be reduced through the use of such techniques because the number of scan pins required to transport data to and from scan chains is reduced as a result of the test data compression. However, if the number of non-scan I/Os of a device is very high, then testing typically still requires an expensive ATE to deliver all the data to the functional pins.

Multi-site testing is another technique for reducing test application time. Multi-site testing involves reducing the test cost by improving the throughput of the test equipment. Multi-site testing entails applying test data to multiple dies concurrently, and observing the circuit outputs at the same time. Special test equipment is typically used to support multi-site testing. However, if a device has a large number of pins, it is extremely difficult to perform multi-site testing without requiring very expensive functional testers.

As discussed more fully below, reduced pin count testing ("RPCT") is another technique that can be used to reduce the cost of testing. RPCT generally involves reducing the number of test pins used when testing on an ATE. For example, by using RPCT, devices can be tested using structural DFT testers that cost about $200/pin compared to high-end functional testers that cost almost $8-10K/pin. Because RPCT can create significant cost savings, improved architectures that enable high quality testing with reduced numbers of test pins are desired.

SUMMARY

Reduced pin count testing ("RPCT") has proven to be an effective solution to reduce structural test costs in a manufacturing environment. Traditionally, RPCT has focused on stuck-at faults or I/O loop-back tests. However, as circuit feature sizes shrink and new technology nodes are employed, at-speed tests are becoming useful to achieve low defect levels. In this disclosure, embodiments of RPCT architectures that allow, for example, application of at-speed test patterns using low-cost testers that are pin limited are disclosed.

A number of advantages can be realized using embodiments of the disclosed technology. These advantages can be individually realized or realized in combination with one another. The disclosed technology is not limited, however, to embodiments exhibiting these advantages. Certain embodiments of the disclosed RPCT architectures and methodologies, for example, allow application of test vectors for both stuck-at and at-speed fault models. In fact, any fault model that uses a two-pattern test can be used with embodiments of the disclosed infrastructure. The ability to apply transition and path-delay tests makes the use of the disclosed technology attractive when high test quality is desired. The disclosed technology can also help lower test costs by allowing devices to be tested with pin-limited, low-cost testers. For example, certain embodiments of the disclosed RPCT architectures allow the use of less complex probe cards and help minimize yield loss due to bad contacts, impedance mismatches between probes and chip pins, or tester inaccuracy. Further, certain embodiments of the disclosed technology can help extend the life of existing testers that are pin limited but that are less expensive than their counterparts. Still further, because the bandwidth required to interface with the tester can be reduced using certain embodiments of the disclosed technology, multi-site or concurrent testing can be improved. Certain embodiments of the disclosed RPCT architectures can be used in conjunction with test compression techniques in order to reduce the test data volume and test application time.

According to one exemplary embodiment of the disclosed technology, one or more existing boundary scan cells in the circuit are slightly modified to allow application of two-pattern tests in addition to conventional stuck-at fault patterns. Since existing boundary scan cells are re-used, the hardware impact can be reduced. Further, embodiments of the disclosed technology can be used for I/O delay test for high-speed I/O testing.

In another disclosed embodiment, a circuit comprising one or more boundary scan cells coupled to primary input ports or primary output ports of a circuit-under-test is disclosed. The circuit further includes a boundary scan cell controller configured to apply test control signals to the one or more boundary scan cells. The boundary scan cell controller of this embodiment is configured to operate in a mode of operation whereby the controller applies test control signals to the one or more boundary scan cells corresponding to test control signals used to control one or more internal scan chains of the circuit-under-test during testing. The control signals include an at-speed-clock signal generated outside of the boundary scan cell controller. In certain implementations, the at-speed-clock signal is generated by an external tester or by on-chip test circuitry configured to perform at-speed testing. In some implementations, the boundary scan cell controller can be configured to apply the test control signals during testing without changing states. Further, the mode of operation can be a first mode of operation, and the controller can be operable in a second mode of operation whereby test control signals generated by the controller are applied to the one or more boundary scan cells. In some implementations, the one or more boundary scan cells include boundary scan cells that behave in response to the test control signals substantially as scan cells having a single register. Further, the one or more boundary scan cells can include a boundary scan cell operable by the test control signals to serially load two test pattern values into two respective memory elements of the boundary scan cell and to sequentially output the test pattern values onto a parallel output path of the boundary scan cell. In certain implementations, the circuit also includes a decompressor configured to receive compressed test pattern data on one or more input pins, decompress the compressed test pattern into decompressed test pattern data, and output the decompressed test pattern data to the one or more boundary scan cells and to the one or more internal scan chains of the circuit-under-test. The circuit can also include a compactor configured to receive test response data from the one or more boundary scan cells and from the one or more internal scan chains of the circuit-under-test, compress the test response data into compacted test response data, and output the compacted test response data on one or more output pins.

Another disclosed embodiment comprises an electronic device. In this embodiment, the device comprises means for loading one or more test patterns into at least a first set of boundary scan cells coupled to primary input ports of a circuit-under-test and into internal scan chains of the circuit-under-test. The means for loading the one or more test patterns includes means for loading initialization values and transition values into memory elements of respective boundary scan cells of the first set of boundary scan cells. The device further includes means for applying the one or more test patterns to functional logic of the circuit-under-test. The means for applying the one or more test patterns includes means for applying the transition values from the first set of boundary scan cells to the functional logic. The device further includes means for capturing one or more test responses to the test patterns in at least some of the internal scan chains of the circuit-under-test. In certain implementations, the means for capturing the one or more test responses operates substantially at-speed. Further, in some implementations, the means for capturing the one or more test responses includes means for capturing at least a portion of the one or more test responses in a second set of boundary scan cells coupled to primary output ports of the circuit-under-test.

Another disclosed embodiment is an example of a so-called dual-register boundary scan cell. In this embodiment, the boundary scan cell comprises a first memory element and a second memory element having an input coupled to an output of the first memory element. The boundary scan cell further includes a multiplexing circuit having a first input coupled to the output of the first memory element and a second input coupled to an output of the second memory element. In this embodiment, the multiplexing circuit is configured to produce an output value on a serial output path of the boundary scan cell in response to one or more selection signals, the output value being one of the value output from the first memory element or the value output from the second memory element. In certain implementations, the parallel output path of the boundary scan cell is coupled to a primary input port of the circuit-under-test. Further, in some implementations, the parallel input path of the boundary scan is coupled to a primary output port of the circuit-under-test. The boundary scan cell can be controlled by a controller configured to apply test control signals used for controlling internal scan chains of the circuit-under-test to the boundary scan cells during a reduced-pin-count-testing mode of operation.

Methods for testing a circuit are also disclosed herein. For example, in one exemplary method disclosed herein, one or more test patterns are loaded into at least a first set of boundary scan cells coupled to primary input ports of a circuit-under-test and into internal scan chains of the circuit-under-test. The act of loading includes loading initialization values and transition values into memory elements of respective boundary scan cells of the first set of boundary scan cells. The one or more test patterns are applied to functional logic of the circuit-under-test. The act of applying includes applying the transition values from the first set of boundary scan cells to the functional logic. One or more test responses to the test patterns are captured in at least some of the internal scan chains of the circuit-under-test. In some implementations, the act of capturing is performed substantially at-speed. The act of capturing can also be performed so that it occurs not later than one operational clock cycle (corresponding to an operational clock of the circuit-under-test) after the one or more test patterns are applied to the functional logic. The act of capturing can further include capturing at least a portion of the one or more test responses in a second set of boundary scan cells coupled to primary outputs of the circuit-under-test. In some implementations, the applying and capturing acts are performed using a launch-off-shift test approach, a broadside test approach, or both. The method of this embodiment can further include decompressing the test patterns from compressed test pattern data, and compacting the test responses. Moreover, in certain implementations, the loading of the first set of boundary scan cells and the internal scan chains is performed through a single test data input pin. In other implementations, the loading into the first set of boundary scan cells is performed through a serial input pin and wherein the loading of the internal scan chains is performed through one or more parallel input pins.

In another exemplary method disclosed herein, a first test pattern value is loaded into a first memory element of a boundary scan cell and a second test pattern value is loaded into a second memory element of the boundary scan cell. When loaded into the second memory element, the second test pattern value is output from the second memory element and applied through functional logic of the circuit to produce a response to the second test pattern value at one or more scan cells in the circuit. The second memory element is clocked to load the second memory element with the first test pattern value, and the first test pattern value is thereby output from the second memory element and applied through the functional logic of the circuit to produce a response to the first test pattern value at the one or more scan cells in the circuit. The one or more scan cells in the circuit are clocked to capture the response to the first test pattern value. In certain implementations, the first test pattern value and the second test pattern value are test pattern values that create a transition at at least one of the one or more scan cells. Further, in some implementations, the act of clocking the one or more scan cells is performed so that the response is captured in a period of time not greater than one operating-frequency clock cycle from when the first test pattern value is launched into the functional logic from the second memory element. In other implementations, the act of clocking the one or more scan cells is performed so that the response is captured in a period of time substantially equal to one operating-frequency clock cycle from when the first test pattern value is applied to the combinational logic from the second memory element of the boundary scan cell. The clocking acts can be performed using a launch-off-shift test approach or a broadside test approach. Further, the clocking acts can be performed using clock signals generated by a tester or on-chip circuitry configured to perform at-speed testing.

Any of the disclosed methods may be performed or simulated by a computer program, such as an EDA software tool, comprising computer-executable instructions stored on one or more computer-readable media. Similarly, any of the test patterns generated to test the disclosed embodiments using stuck-at and at-speed test patterns can be stored on one or more computer-readable media. Design data for any of the disclosed RPCT architectures can be created using a software program, such as a boundary scan insertion tool, comprising computer-executable instructions stored on one or more computer-readable media. The foregoing and additional features and advantages of the disclosed embodiments will become more apparent from the following detailed description, which proceeds with reference to the following drawings.

BRIEF DESCRIPTION OF THE DRAWINGS

FIG. 10 is a flowchart of a method for generating design data to implement any of the disclosed circuit embodiments using the network of FIG. 9.

DETAILED DESCRIPTION

General Considerations

Figure 1:
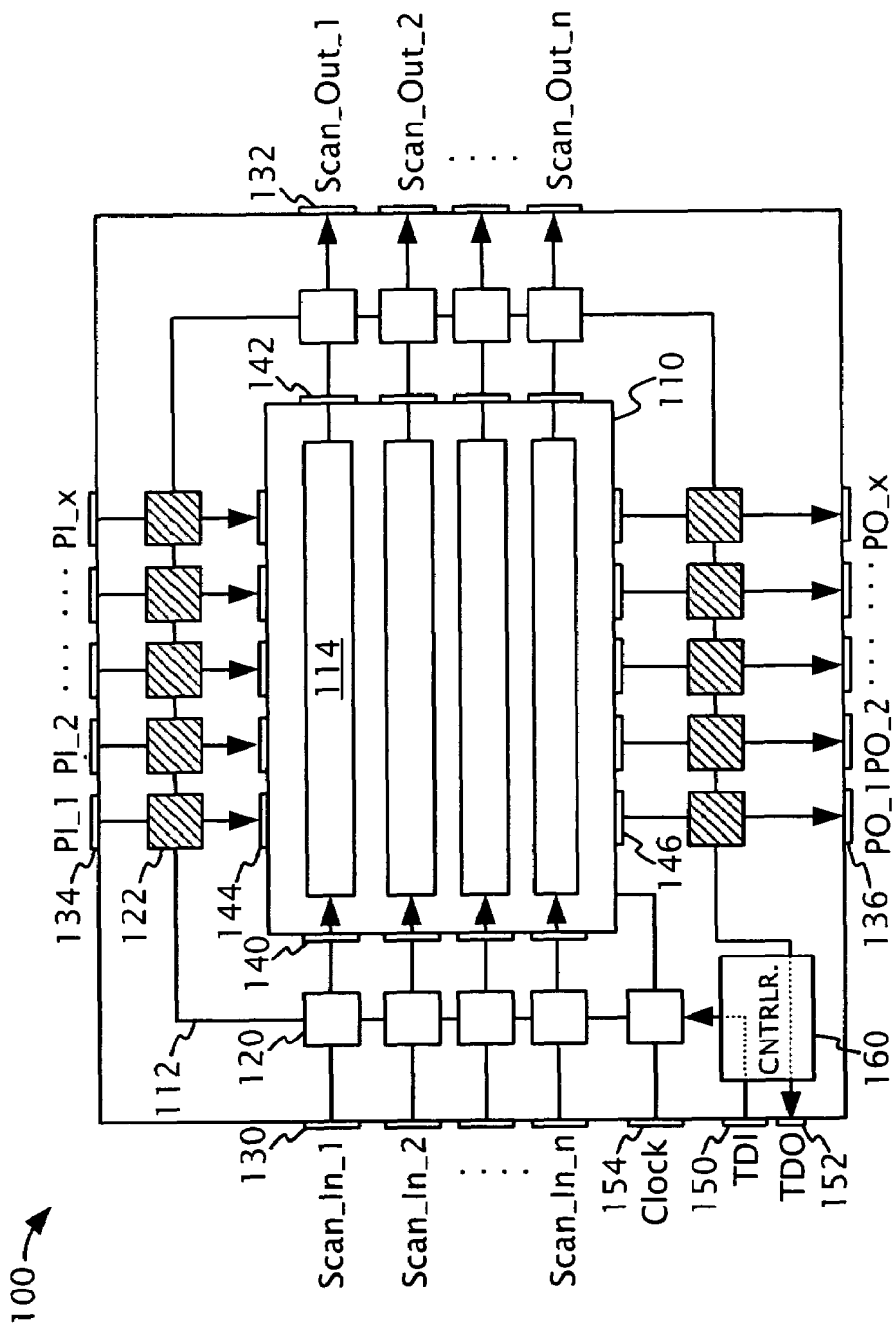
FIG. 1 is a schematic block diagram of an exemplary RPCT architecture according to the disclosed technology.

Disclosed herein are representative embodiments of testing architectures as well as methods for using and designing such embodiments that should not be construed as limiting in any way. Instead, the present disclosure is directed toward novel and nonobvious features and aspects of the various disclosed apparatus and methods, and their equivalents, alone and in various combinations and subcombinations with one another. The invention is not limited to any specific aspect or feature, or combination thereof, nor do the disclosed methods and apparatus require that any one or more specific advantages be present or problems be solved.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not exclude the presence of intermediate elements between the coupled items.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus. Additionally, the description sometimes uses terms like "provide" and "launch" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of integrated circuits or digital devices (e.g., application-specific integrated circuits ("ASICs"), systems-on-a-chip ("SoCs"), system-in-a-package ("SIPs"), or programmable logic devices ("PLDs") such as field programmable gate arrays ("FPGAs")), having a variety of different electrical components (e.g., digital components, analog components, or mixed-signal components). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits with embodiments of the disclosed technology or equivalents are considered to be within the scope of this disclosure.

Any of the apparatus described herein can be designed, verified, and/or simulated using software that comprises computer-executable instructions stored on one or more computer-readable media. Such software can comprise, for example, an electronic-design-automation ("EDA") software tool, such as a JTAG logic or boundary scan insertion tool or a design, verification, or simulation tool. Similarly, any of the methods described herein can be performed or simulated using software comprising computer-executable instruction stored on one or more computer-readable media. Any such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

Further, any of the disclosed apparatus can be stored as circuit design information on one or more computer-readable media. For example, one or more data structures or databases containing circuit design information (e.g., a netlist, an HDL file, a GDSII file, an Oasis file, or other such file) can be created or updated to include design information for any of the disclosed architectures. Similarly, a data structure or database containing test patterns to be applied to or test results from any of the disclosed architectures or procedures can be created or updated and stored on one or more computer-readable media. Such data structures or databases can be created or updated at a local computer or over a network (e.g., by a server computer).

Boundary Scan, in General

Although particular reference is made to the IEEE 1149.1 Standard, the disclosed technology is not limited to circuits or test environments operating according to the standard. Instead, the disclosed technology can be more widely applied to other circuit testing environments utilizing other forms of boundary scan technology.

A typical implementation of an IEEE 1149.1 compliant test interface uses boundary scan cells at one or more of the functional pins of a chip and configures the cells into a boundary scan register during test mode. The boundary scan register is typically controlled by a state machine (termed the "boundary scan cell controller," "TAP controller," or sometimes just the "controller") that can be accessed through a four or five pin test access port ("TAP") at the chip's boundary. The state machine can load, for example, various instructions that enable the user to switch to a standard boundary scan mode or custom mode. Standard modes typically enable basic interconnect testing at the board level, while custom modes can be enabled by private instructions and used to allow access to internal registers. For example, custom modes are often used to initialize and check the status of the built-in self-test ("BIST") circuitry.

Exemplary Embodiments of Improved Reduced Pin Count Testing Architectures

An exemplary configuration of a Reduced Pin Count Testing ("RPCT") architecture according to the disclosed technology is shown in FIG. 1. In particular, FIG. 1 shows a circuit 100 (for example, a chip) comprising a circuit-under-test ("CUT") 110 and a boundary scan register 112. In the illustrated embodiment, the boundary scan register 112 comprises multiple boundary scan cells 120, 122 coupled between respective pins of the circuit 100 (sometimes referred to as "pads") and respective input and output ports of the CUT 110. In the illustrated embodiment, the pins of the circuit 100 include "scan-in pins" 130 and "scan-in ports" 140, which are respectively coupled to internal scan chains 114 of the CUT 110. (For purposes of clearer presentation, only a single scan-in pin 130, scan-in port 140, boundary scan cell 120, and associated scan chain 114 are labeled in FIG. 1. It should be understood, however, that multiple scan-in pins, scan-in ports, boundary scan cells, and scan chains are shown in the figure and can be readily identified by one of ordinary skill in the art. The remaining figures of the application use a similar labeling convention for components shown therein.) The scan-in pins 130 and scan-in ports 140 can be used to load one or more internal scan chains 114 of the CUT 110 with test pattern values during testing. The circuit 100 further includes "scan-out pins" 132 and "scan-out ports" 142, which are also coupled to the internal scan chains 114 of the CUT 110. The scan-out pins 132 and scan-out ports 142 can be used to receive data shifted out from the scan chains 114, corresponding, for example, to the combinational logic of the CUT's 110 response to a test pattern.

The circuit 100 additionally includes "primary input pins" 134 and "primary input ports" 144, which are not coupled to any scan chain but provide functional inputs to the combinational logic of the CUT 110. The circuit 100 also includes "primary output pins" 136 and "primary output ports" 146, which are not coupled to any scan chain but provide functional outputs from the logic of the CUT 110. It should be understood that ports 140, 142, 144, 146 are shown in FIG. 1 as well as the other figures of this application as comprising a separate circuit component for illustrative purposes. The term "port" refers more broadly to a circuit path or node in the CUT 110 that is configured to receive data from or output data to a corresponding pin.

In FIG. 1, boundary scan cells 120, 122 of the boundary scan register 112 are coupled between respective pins of the circuit 100 and ports of the CUT 110. In the exemplary embodiment illustrated in FIG. 1, the boundary scan cells 120 associated with the scan-in pins 130 and the scan-out pins 132 comprise standard boundary scan cells that can be configured to operate, for example, in a pass-through mode whereby serial data can be loaded through the boundary scan register 112 (e.g., from test data input 150 ("TDI")) and whereby parallel data from an associated scan-in pin (or to an associated scan-out pin) can be simultaneously clocked through the boundary scan cell 120.

By contrast, the boundary scan cells 122 associated with the primary-input pins 134 and the primary-output pins 136 comprise so-called "RPCT scan cells" or "RPCT boundary scan cells." The RPCT boundary scan cells 122 of the illustrated embodiment are capable of applying test pattern values on the primary-input ports 144 or capturing test pattern responses from the primary-output ports 146 during testing of the CUT 110. With this additional access provided during testing, the primary-input pins 134 and primary-output pins 136 do not need to be directly connected to a tester, thus allowing the use of a low-pin tester for accessing only the scan pins (for example, scan-in pins 130 and scan-out pins 132), clocks (for example, clock pin 154), and TAP pins (for example, TDI pin 150 and test-data output ("TDO") pin 152). Furthermore, and according to certain exemplary embodiments, the RPCT boundary scan cells 122 can be operated using the control signals used to operate the scan cells of the internal scan chains (for example, the "scan enable" and "test clock" signals). Thus, the RPCT boundary scan cells 122 can launch and capture test data at-speed and also provide enhanced test coverage by testing circuit paths not ordinarily accessible during RPCT.

According to one exemplary RPCT technique, the TAP controller (e.g., controller 160) remains active during the test session. A separate instruction corresponding to RPCT is loaded into the TAP controller to configure the boundary scan cells into an RPCT test mode. In some implementations, this mode is initialized prior to the application of the test patterns and maintained during at least part of the application of the test patterns (for example, during application of the entire set of test patterns). During the test mode, the boundary scan cells 120 for the scan pins 130, 132 and the clock pins 150 can operate in a pass-through mode where serial and parallel data are loaded simultaneously. Thus, in this exemplary embodiment, the boundary scan register 112 can be loaded (for example, via TDI pin 150) along with the internal scan chains 114 during the scan-shift mode of operation during testing. If the lengths of the internal scan chains 114 are longer than the length of the boundary scan register 112, the scan load/unload cycle time will typically not be affected by the loading of the boundary scan register 112.

The RPCT boundary scan cells can comprise modified versions of the cells specified by the IEEE 1149.1, such as those disclosed below with respect to FIGS. 2, 4, and 5. It should be understood, however, that the concepts described herein can be applied to any boundary scan cell currently known or hereafter developed. Thus, the specific modifications described below are intended to illustrate the principles of the disclosed technology without being limited to the particular embodiments described.

Exemplary Single-Register RPCT Cell Designs

Figure 2:
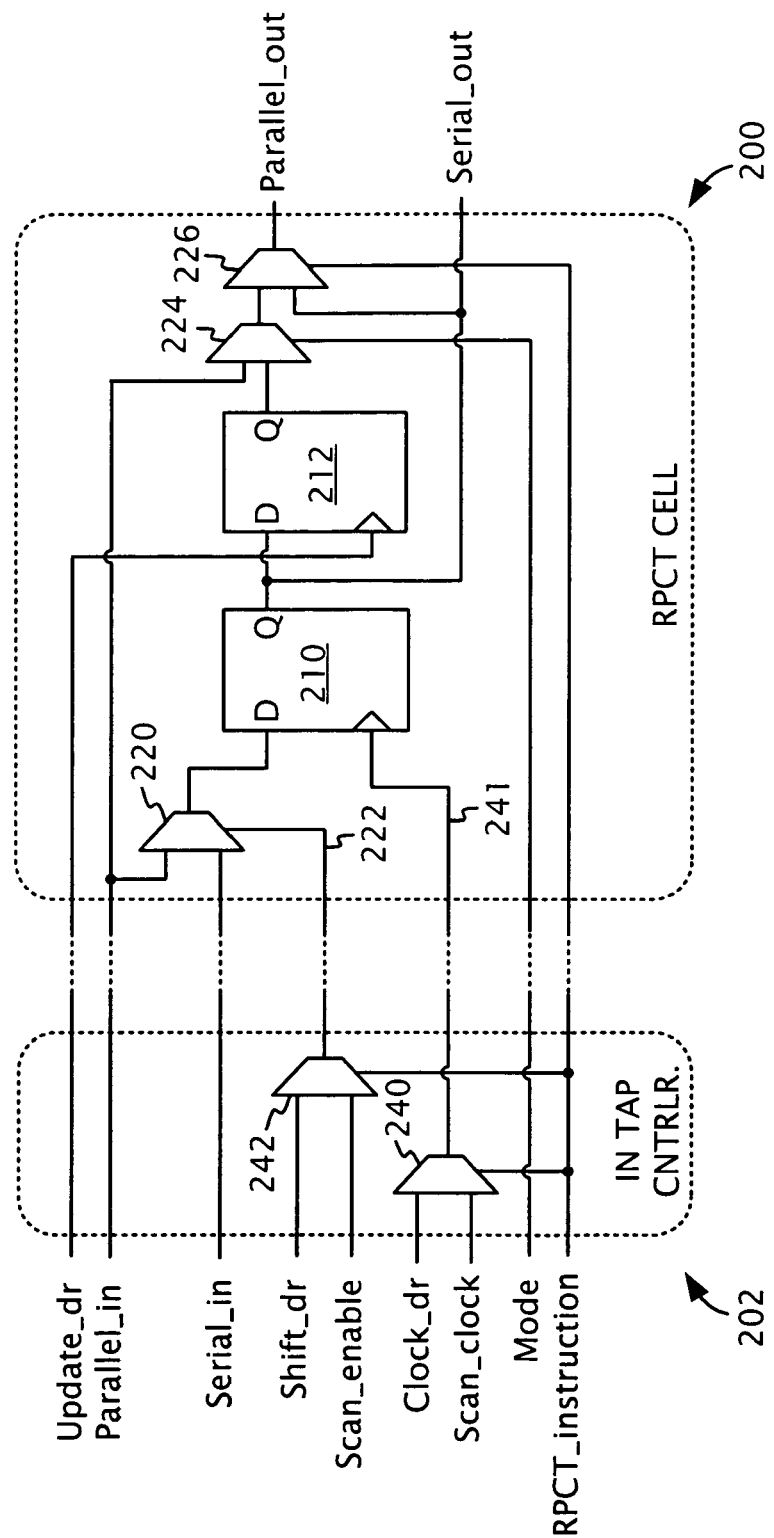
FIG. 2 is a schematic block diagram of a first RPCT boundary scan cell that can be used in embodiments of the disclosed RPCT architecture, such as the RPCT architectures of FIGS. 1, 3, and 6.

FIG. 2 shows an example cell 200 based on the IEEE 1149.1 standard BC__1 cell. In this exemplary embodiment, cell 200 comprises a first memory element 210 and a second memory element 212. The memory elements 210, 212 can comprise any suitable sequential element (e.g., a flip-flop or latch) but in one particular embodiment comprise D-type flip-flops. In this disclosure, a memory element within a boundary scan cell is sometimes referred to as a "register." Note that this usage of the term is to be distinguished from the phrase "boundary scan register," which refers to a plurality of boundary scan cells serially coupled together. Whether the term "register" refers to a single memory element or to a plurality of boundary scan cells will be apparent from the context.

The example cell 200 further comprises an input data multiplexer 220 having an output coupled to the data input ("D") of the first memory element 210. The input data multiplexer 220 is configured to receive parallel input data on a parallel input data path (parallel_in) and serial input data on a serial input data path (serial_in). The input data multiplexer 220 is controlled by a selection signal on input data selection path 222 received from a TAP controller 202. In the illustrated cell 200, the first memory element 210 has an output (e.g., the "Q" output) coupled to the data input ("D") of the second memory element 212 and to a serial output path (serial_out). The second memory element 212 has an output coupled to an input of a first parallel output multiplexer 224. The first parallel output multiplexer 224 has another input coupled to the parallel input data path (parallel_in) and is selectively controlled by a mode selection signal on a mode selection path (mode). The first parallel output multiplexer 224 has an output that is coupled to an input of a second parallel output multiplexer 226. The second parallel output multiplexer has another input coupled directly to the output of the first memory element 210 and is selectively operated by the signal on the RPCT instruction path (RPCT_instruction). Together, the first parallel output multiplexer 224 and the second parallel output multiplexer 226 form a multiplexing circuit that outputs one of the following on the parallel_out path: parallel input data from the parallel_in path, the data output from the first memory element 210, or the data output from the second memory element 212.

The first memory element 210 is clocked by a clock signal on a first clock path 241, whereas the second memory element 212 is clocked by an update clock signal on an update clock path (update_dr). In the illustrated embodiment, both the clock signal on the first clock path 241 and the update signal are received from the TAP controller 202. The TAP controller 202 of this embodiment includes a clock signal multiplexer 240 that determines whether the clock signal on the first clock path 241 is a scan clock signal from a scan clock path (scan_clock) or a TAP controller clock signal from a TAP controller clock path (clock_dr). In this embodiment, the scan clock signal on path scan_clock corresponds to the clock used to control operation of the internal scan chains during core testing. The scan clock signal can be provided, for example, directly by a tester or by on-chip test circuitry (e.g,. on-chip test circuitry configured to perform at-speed testing). By contrast, the TAP controller clock signal on the clock_dr path corresponds to the clock signal generated by the TAP controller and used to clock the first memory element 210 during boundary scan register operations. (It should be noted that for ease of illustration, the TAP controller in FIG. 2, as well as the TAP controller in FIGS. 4 and 5, are shown as including certain signal paths that are not actually in the TAP controller. For example, the parallel_in paths do not actually pass through the TAP controllers.) In the embodiment illustrated in FIG. 2, the TAP controller 202 further includes an input mode multiplexer 242 that determines whether the selection signal on the input data selection path 222 is a TAP controller shift mode signal on TAP controller shift mode path (shift_dr) or scan enable signal on scan enable path (scan_enable). In this embodiment, the scan enable signal on the scan_enable path corresponds to the signal used during testing to control whether the scan cells of the internal scan chains operate in a shift mode or a capture mode. The scan enable signal can be provided, for example, directly from a tester or from on-chip test circuitry.

In comparison with a standard IEEE 1149.1 BC__1 cell, the exemplary cell 200 additionally includes the second parallel output multiplexer 226, which has an input coupled directly to the output of the first memory element 210. Thus, for example, during an RPCT mode (determined by the signal on the path RPCT_instruction), the cell 200 outputs data directly from the first memory element 210 on the parallel output path (parallel_out) instead of the data from the second memory element 212. Consequently, the data from the first memory element 210 can be output from the RPCT cell 200 in a single clock cycle. The addition of the second parallel output multiplexer 226 to the standard BC_1 cell is a relatively minor modification that does not add significant area overhead to the boundary scan cell design. Consequently, the impact of adding such single-register RPCT boundary scan cells to a design is small.

Furthermore, the exemplary TAP controller 202 differs from a standard 1149.1 TAP controller in that it includes clock multiplexer 240 and input mode multiplexer 242, both controlled by the signal on the path RPCT_instruction. Thus, for example, when the TAP controller 202 is operating in the RPCT mode, the signals routed to the RPCT cell 200 from the TAP controller 202 comprise the scan enable signal on the scan_enable path and the scan clock signal on the scan_clock path. Consequently, and in combination with the second parallel output multiplexer 226, the RPCT cell 200 behaves substantially as an internal scan cell when operating in the RPCT mode. For example, the RPCT cell 200 can shift and capture data in substantially the same manner as the internal scan chains in the circuit-under-test. Because the exemplary RPCT scan cell 200 uses a single memory element (the first memory element 210) during RPCT operation, cell 200 is sometimes referred to herein as a "single-register RPCT cell." By using single-register RPCT cells at the primary input and primary output nodes of the circuit-under-test, the functional pathways between the RPCT boundary scan cells and corresponding downstream scan cells in the circuit-under-test can be tested (e.g., using static test patterns, such as test patterns targeting stuck-at faults).

Figure 3:
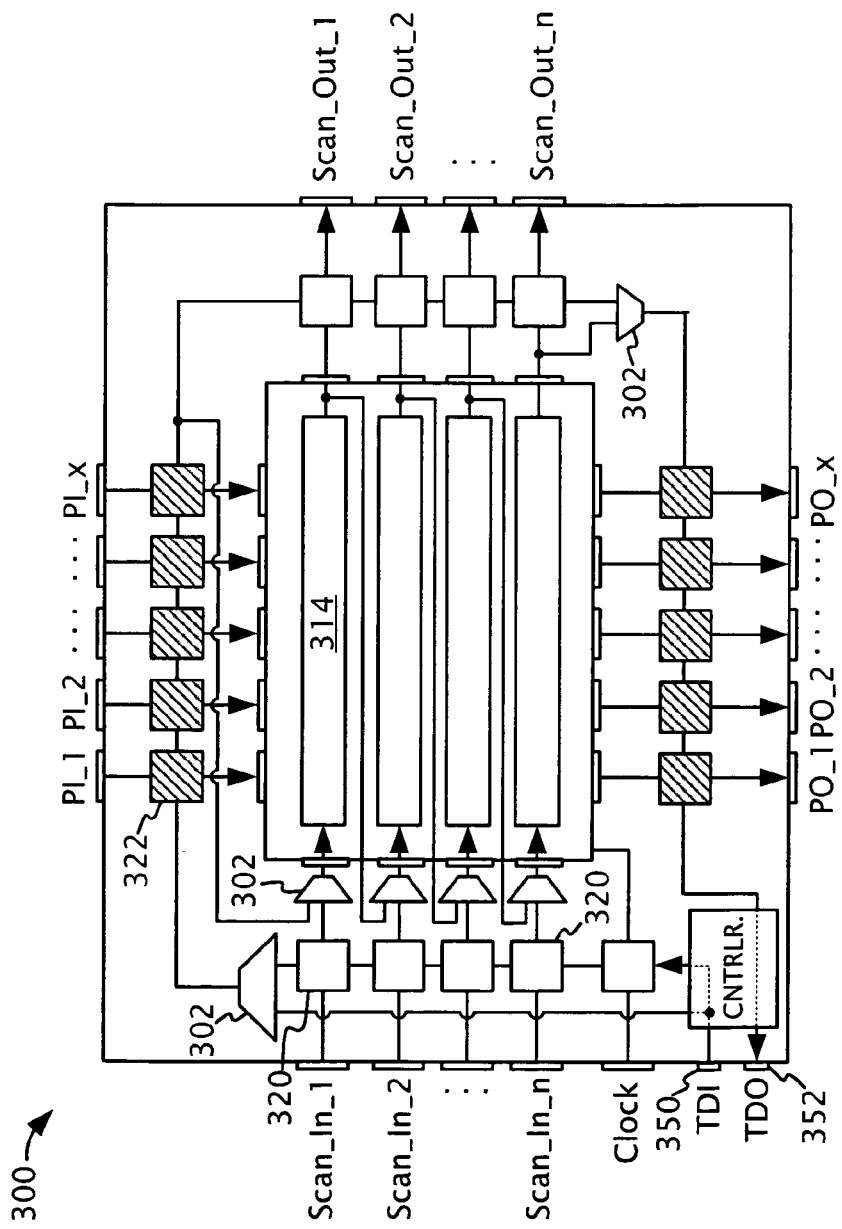
FIG. 3 is a schematic block diagram of another exemplary RPCT architecture that can use embodiments of the disclosed RPCT boundary scan cells. In the exemplary RPCT architecture of FIG. 3, test data is loaded and unloaded through single respective test data input pins and test data output pins.

Another example of an RPCT architecture using embodiments of the single-register RPCT cell 200 (or any of the RPCT cell embodiments described herein) is illustrated in FIG. 3. In particular, FIG. 3 shows an RPCT architecture 300 comprising boundary scan cells 320 and RPCT boundary scan cells 322 corresponding to embodiments of the single-register boundary scan cell described above with respect to FIG. 2. The RPCT architecture 300 further includes circuit paths and multiplexers 302 (e.g., one to bypass the boundary scan cells 320 coupled to the scan-in pins, four coupled to the scan-in nodes, and one to bypass the last boundary scan cell 320 coupled to the scan-out pin) configured to couple together the RPCT boundary scan cells 322 and the scan cells of the internal scan chains 314 so as to form at least one scan chain (termed an "RPCT scan chain") when an RPCT mode is selected at the multiplexers 302. For example, in the illustrated embodiment, the RPCT boundary scan cells 322 and the internal scan chains 314 can be operated together in RPCT mode as a single scan chain, into which data is loaded via TDI pin 350 and out of which data in unloaded via TDO pin 352. This particular implementation should not be construed as limiting, however, as different configurations are possible without departing from the principles of the disclosed technology. For example, any number of internal scan chains or any number of RPCT boundary scan cells can be used in forming the RPCT scan chain. Furthermore, the RPCT scan chain can be formed using fewer than all of the internal scan chains or scan cells. For instance, in certain embodiments, one or more scan-in pins and scan-out pins are still used during the RPCT mode to provide access to internal scan chains not included in the RPCT scan chain.

By using an RPCT architecture such as that exemplified in FIG. 3, tester access to scan-input and scan-output pins can be further reduced. For example, a single scan chain between TDI 350 and TDO 352 can be created by concatenating the RPCT boundary scan cells with the scan cells of the internal scan chains. This exemplary architecture allows one to use JTAG testers that operate using only JTAG pins and that are available on the market at relatively low costs.

Exemplary Dual-Register RPCT Cell Design

Figure 4:
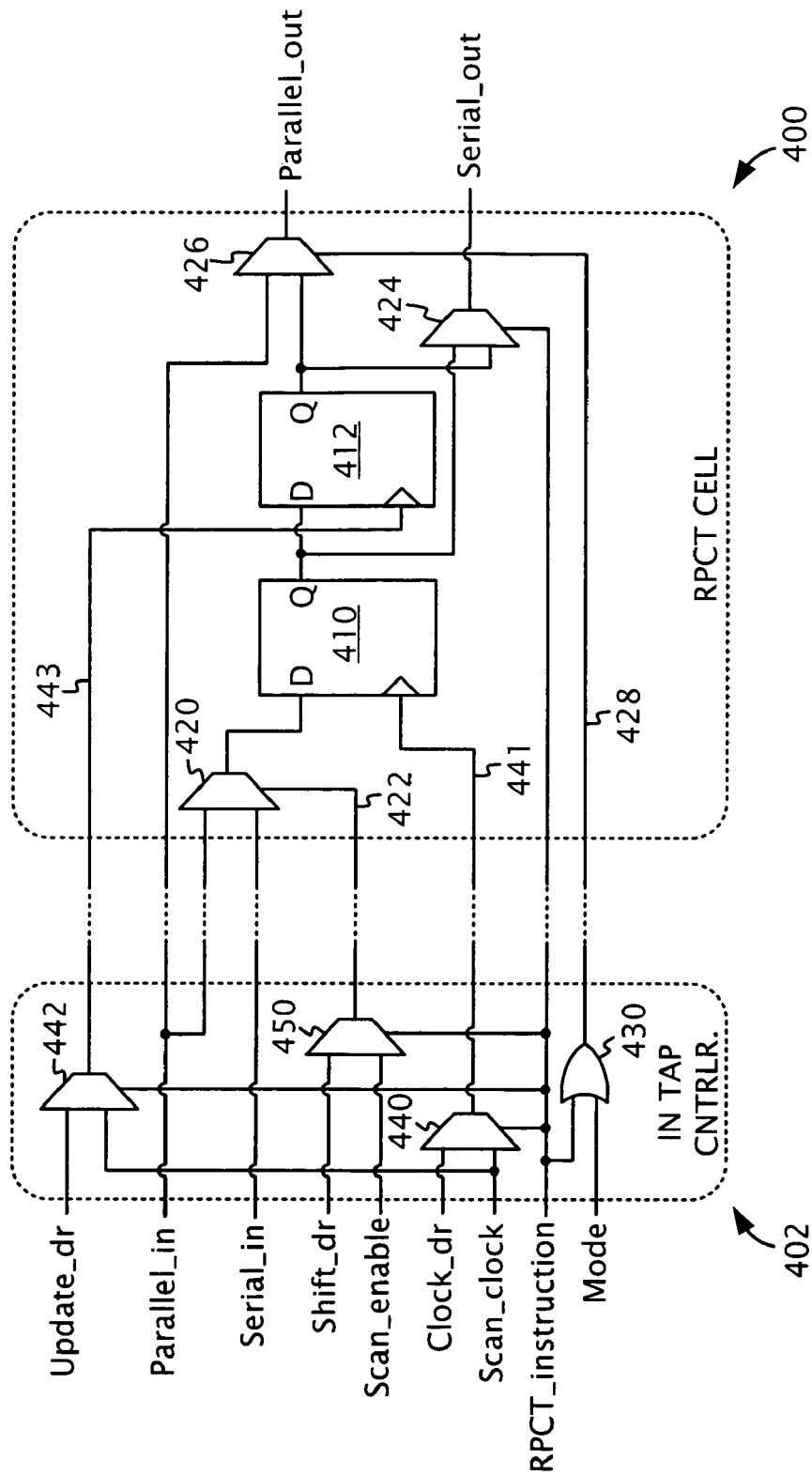
FIG. 4 is a schematic block diagram of a second RPCT boundary scan cell that can be used in embodiments of the disclosed RPCT architecture, such as the RPCT architectures of FIGS. 1, 3, and 6.

FIG. 4 shows an example RPCT boundary scan cell 400 that can be used in any of the disclosed RPCT architectures and that is also based on the IEEE 1149.1 standard BC_1 cell. As more fully explained below, the example cell 400 can be used to perform at-speed testing. For instance, test patterns targeting transitional faults can be applied to a circuit-under-test through the use of such boundary scan cells. In the illustrated embodiment, cell 400 comprises a first memory element 410 and a second memory element 412. The memory elements 410, 412 can comprise any suitable sequential element (e.g., a flip-flop or latch) but in one particular embodiment comprise D-type flip-flops.

The example cell 400 further comprises an input data multiplexer 420 having an output coupled to the data input ("D") of the first memory element 410. The input data multiplexer 420 is configured to receive parallel input data on a parallel input data path (parallel_in) and serial input data on a serial input path (serial_in). The input multiplexer 420 is controlled by a selection signal on input data selection path 422 received from a TAP controller 402. In the illustrated cell 400, the first memory element 410 has an output (e.g., the "Q" output) coupled to the data input ("D") of the second memory element 412 and to a serial output multiplexer 424, which provides a serial output signal on a serial output path (serial_out). The second memory element 412 has an output coupled to the other input of the serial output multiplexer 424 and to an input of a parallel output multiplexer 426. The serial output multiplexer 424 provides a serial output on the serial output path (serial_out) and is controlled by a signal on the RPCT instruction path (RPCT_instruction). Thus, depending on the value of the signal on the RPCT_instruction path, the cell 400 either outputs the data from the first memory element 410 or the second memory element 412 on the serial_out path.

Data on the parallel output path (parallel_out) is controlled by the parallel output multiplexer 426. The parallel output multiplexer 426 has one input coupled to the output of the second memory element 412 and another input coupled to the parallel input data path (parallel_in). Thus, depending on the value of the signal on the parallel output selection path 428, the cell 400 outputs either the data from the second memory element 412 or the parallel input data on the parallel_in path. In the illustrated embodiment, the value on the parallel output selection path 428 is determined by the output of logic gate 430 (in FIG. 4, an OR gate). In this exemplary embodiment, the logic OR gate 430 receives the mode signal on the mode path and the RPCT instruction signal on the RPCT_instruction path.

Furthermore, in the exemplary RPCT boundary scan cell 400 shown in FIG. 4, the first memory element 410 is clocked by a clock signal on a first clock path 441, whereas the second memory element 412 is clocked by a clock signal on a second clock path 443. In the illustrated embodiment, both the clock signal on the first clock path 441 and the clock signal on the second clock path 443 are received from the TAP controller 402. The TAP controller 402 of this embodiment includes a first memory element clock signal multiplexer 440 that determines whether the clock signal on the first clock path 441 is a scan clock signal from a scan clock path (scan_clock) or a TAP controller clock signal from a TAP controller clock path (clock_dr). In this embodiment, the scan clock signal on the scan_clock path corresponds to the clock used to control operation of the internal scan chains during core testing. The scan clock signal can be provided, for example, directly by a tester or by on-chip test circuitry (e.g., on-chip test hardware configured to perform at-speed testing). By contrast, the TAP controller clock signal on the clock_dr path corresponds to the clock signal generated by the TAP controller 402 and used to load the first memory element 410 during boundary scan register operations.

In this embodiment, the TAP controller 402 further includes a second memory element clock signal multiplexer 442 that determines whether the clock signal on the second clock path 443 is the scan clock signal from the scan_clock path or an update signal from an update clock path (update_dr). In this embodiment, the update clock signal on the update_dr path corresponds to the update signal generated by the TAP controller and used during boundary scan register operations to load the value from the first memory element 410 to the second memory element 412.

The exemplary cell 400 further includes an input mode multiplexer 450 that determines whether the selection signal on the input data selection path 422 is a TAP controller shift mode signal on TAP controller shift mode path (shift_dr) or a scan enable signal on the scan_enable path. In this embodiment, the scan enable signal on the scan_enable path corresponds to the signal used during testing to control whether the scan cells of the internal scan chains in the circuit-under-test operate in a shift mode or a capture mode. The scan enable signal can be provided, for example, directly from a tester or from on-chip test circuitry.

In comparison with a standard IEEE 1149.1 BC_1 cell, the exemplary cell 400 additionally includes the serial output multiplexer 424, which has an input coupled to the output of the first memory element 410 and an input coupled to the output of the second memory element 412. Thus, for example, during an RPCT mode (determined by the signal on the RPCT_instruction path), the cell 400 outputs data from the second memory element 412 on the serial_out path instead of the data from the first memory element 410 when the cell 400 is not in the RPCT mode. Furthermore, when the cell 400 is operating in the RPCT mode, the parallel output multiplexer 426 outputs data from the second memory element 412 on the parallel_output path. The addition of the serial output multiplexer 424 to the standard BC_1 cell is a relatively minor modification that does not add significant area overhead to the boundary scan cell design. Consequently, the impact of adding such dual-register RPCT boundary scan cells to a design is small.

Furthermore, the exemplary TAP controller 402 differs from a standard 1149.1 TAP controller in that it includes first memory element clock multiplexer 440, second memory element clock multiplexer 442, input mode multiplexer 450 and logic gate 430, all controlled by the signal on the RPCT_instruction path. Thus, for example, when the TAP controller 402 is operating in the RPCT mode, the clock signals routed to the first and second memory elements 410, 412 are the scan clock signal on the scan_clock path and the input selection signal related to the input selection path 422 is the scan enable signal on the scan_enable path. Consequently, and in combination with the serial output multiplexer 424 routing the output of the second memory element 412 to the serial_out path, the exemplary RPCT boundary scan cell 400 behaves substantially as an internal scan cell having two serially coupled memory elements when operating in the RPCT mode. Because the exemplary RPCT boundary scan cell 400 uses two memory elements during RPCT operation, it is sometimes referred to herein as a "dual-register RPCT cell."

One possible advantage of the exemplary dual-register RPCT cell 400 is that the RPCT cell 400 can use its two memory elements 410, 412 to create an initialization value and a transition value (or launch event) that can be used to detect at-speed faults in the functional pathways between the cell 400 and the first downstream scan cell in the circuit-under-test.

An exemplary method of operating the dual-register RPCT cell 400 during testing is described below. It is assumed for purposes of this example that the dual-register RPCT cell 400 referred to is an RPCT boundary scan cell coupled to a primary input node of the CUT. Thus, in this example, the dual-register RPCT cell 400 applies the at-speed test pattern to the CUT. The application of the initialization and the transition values that are used to test at-speed faults (such as path delay, slow-to-rise or slow-to-fall transition behaviors) can be performed using one of at least two test techniques: launch-off-shift or broadside testing. Both of these techniques are discussed below with reference to FIGS. 7 and 8.

Figure 7:
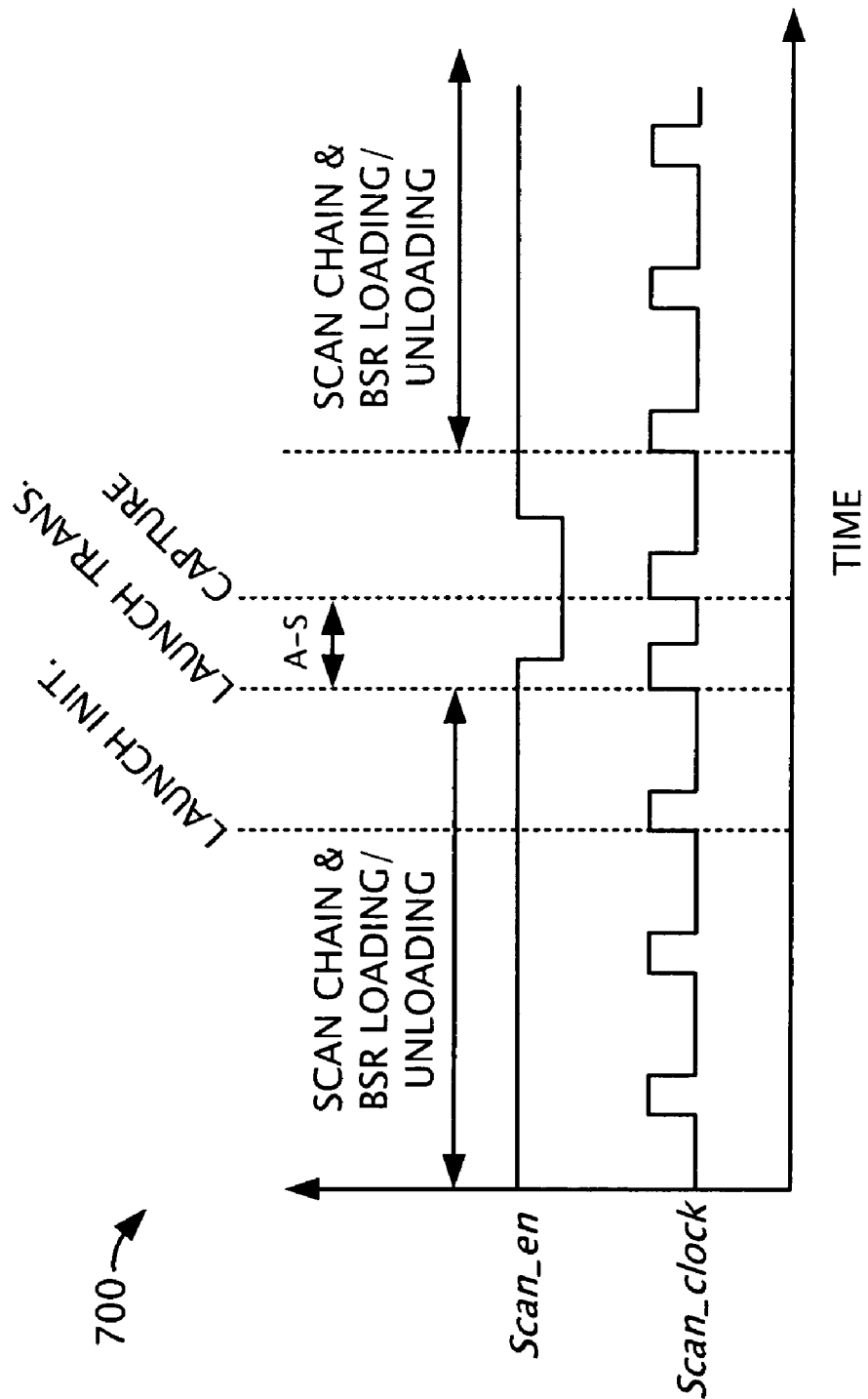
FIG. 7 is a timing diagram illustrating the launch-off-shift testing technique that can be used in embodiments of the disclosed technology.

FIG. 7 is a timing diagram illustrating the launch-off-shift technique and is described below with reference to the exemplary dual-register RPCT scan cell 400. While operating in the RPCT mode, the exemplary dual-register RPCT cell 400 is loaded sequentially with test pattern values through the serial pathways serial_in and serial_out (much like a standard scan chain). In FIG. 7, loading and unloading occur at a slower clock frequency than the at-speed testing, though in other embodiments the frequency may be the same as the at-speed frequency or faster. During this phase of operation, the scan enable signal on the scan_enable path is asserted so that the input data received into the RPCT boundary scan cell 400 is from the serial_in path (the associated scan enable signal can correspond to the scan enable signal being high or low, depending on the implementation). Before the test pattern is launched and the circuit response captured, the second memory element 412 is loaded with an initialization value and the first memory element 410 is loaded with a transition value. Because the RPCT cell is operating in the RPCT mode, the initialization value at the output of the second memory element 412 is applied to the functional logic of the CUT through the parallel_out path, which is coupled to a primary input port of the CUT. This event is illustrated in FIG. 7 at time "launch init." The scan clock signal on the scan_clock path applies a first clock pulse to the first and second memory elements 410, 412, thereby advancing the transition value into the second memory element 412, where it is launched into the functional logic of the CUT through the parallel_out path. This event is illustrated in FIG. 7 at time "launch trans." Before the next clock pulse, the scan enable signal is deasserted, thereby configuring the scan cells of the internal scan chains (as well as the first memory element of any dual-register RPCT cells coupled to the primary output nodes of the CUT) into their functional mode of operation so that they can capture the circuit response to the transition value. To capture the circuit response, the scan clock signal on the scan_clock path applies a second clock pulse to the scan cells of the internal scan chains and, in the illustrated embodiment, to the memory elements of the dual-register RPCT cells 400. This event is illustrated in FIG. 7 at time "capture." In certain embodiments, the second clock pulse is applied at-speed— that is, at or substantially at the operating frequency of the functional pathways being tested (as measured, for example, by the operational or functional clocks of the scan cells where the test response is captured). This event is illustrated in FIG.

7 as time period "A-S." For example, in specific embodiments, the second clock pulse (the capture pulse) is provided no later than one operating-frequency clock cycle from the first clock pulse (the launch pulse). In other embodiments, the second clock pulse (the capture pulse) is provided substantially at-speed (e.g., within a tolerance of 1%, 5%, 10%, or 15% of the desired operating-frequency clock cycle or within other desirable tolerances).

Figure 8:
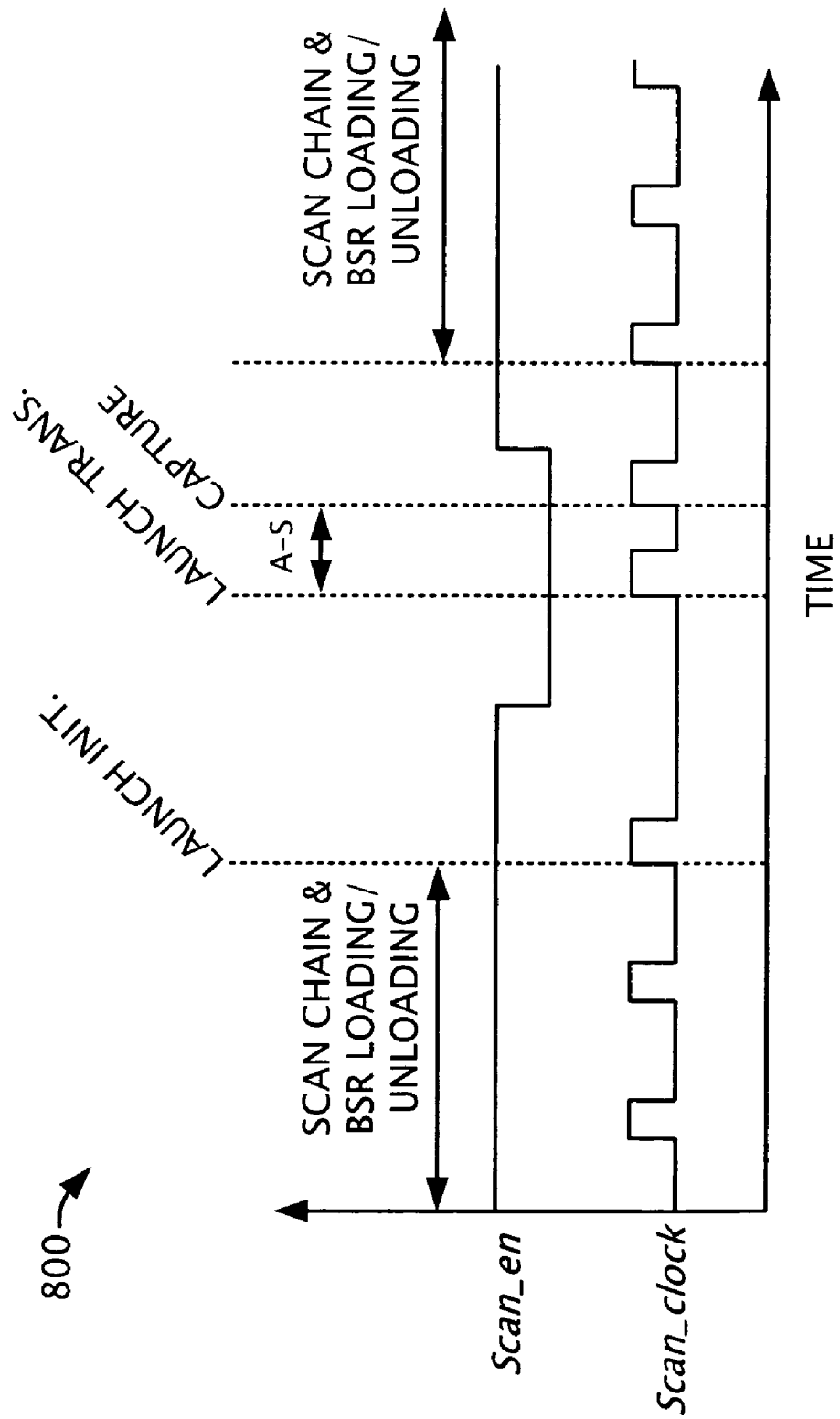
FIG. 8 is a timing diagram illustrating the broadside testing technique that can be used in embodiments of the disclosed technology.

FIG. 8 is a timing diagram illustrating the broadside testing technique as can be used with embodiments of the disclosed technology. For illustration purposes, reference will again be made to an exemplary dual-register RPCT scan cell 400 coupled to a primary input port of the circuit-under-test. While operating in the RPCT mode, the exemplary dual-register RPCT cell 400 is loaded serially with test pattern values through the serial_in and serial_out serial pathways. In FIG. 8, loading and unloading occurs at a slower clock frequency than the at-speed pulses in the capture window, though in other embodiments the frequency may be the same as the at-speed frequency or faster. During this phase of operation, the scan enable signal on the scan_enable path is asserted. Before the test pattern is launched and the circuit response captured, the second memory element 412 is loaded with an initialization value and the first memory element 410 is loaded with a transition value. Because the RPCT cell is operating in the RPCT mode, the initialization value at the output of the second memory element 412 is applied to functional logic of the CUT through the parallel_out path. This event is illustrated in FIG. 8 at time "launch init." Before the next clock pulse, the scan enable signal on the scan_enable path is deasserted, thereby configuring the scan cells of the internal scan chains into their functional mode of operation so that they can capture the circuit response to the transition value. To allow for the scan enable signal to propagate to all of the scan cells of the internal scan chains (as well as to the RPCT boundary scan cells), the scan clock signal may be delayed (or suppressed) for a period of time as illustrated in FIG. 8. With the scan enable signal deasserted, the scan clock signal on the scan_clock path applies a first clock pulse to the first and second memory elements 410, 412, thereby advancing the transition value into the second memory element 412, where it is launched into the functional logic of the CUT through the parallel_out path. This event is illustrated in FIG. 8 at time "launch trans." The scan clock signal on the scan_clock path applies a second clock pulse to the scan cells of the internal scan chains and, in the illustrated embodiment, to the memory elements of the dual-register RPCT cells 400. Because the scan cells of the internal scan chains (as well as the RPCT boundary scan cells) are still operating in their functional mode (because the scan-enable signal is still desasserted), the test response to the transition can be captured. This event is illustrated in FIG. 7 at time "capture." In certain embodiments, the second clock pulse is applied at-speed—that is, at or substantially at the operational frequency of the functional pathways being tested (as measured, for example, by the operating or functional clocks of the scan cells where the test response is captured). For example, in specific embodiments, the second clock pulse (the capture pulse) is provided no later than one operating-frequency clock cycle from the first clock pulse (the launch pulse). In other embodiments, the second clock pulse (the capture pulse) is provided substantially at-speed (e.g., within a tolerance of 1%, 5%, 10%, or 15% of the desired operating-frequency clock cycle or within other desirable tolerances).

Furthermore, it should be noted that the CUT may operate in multiple clock domains, and thus the at-speed pulses applied may vary depending on which clock domain the functional pathways being tested are located. Once captured, the test responses can be shifted out of the internal scan cells and boundary scan cells, and analyzed to determine whether any at-speed faults are detected on the targeted pathways.

By using embodiments of the dual-register RPCT scan cell, the functional paths between the RPCT boundary scan cells and the first functional scan cells encountered in the CUT can be tested for at-speed faults. Further, by using RPCT boundary scan cells coupled to the primary output ports of the CUT (such as embodiments of the single-register RPCT scan cell 200 described above or embodiments of the dual-register RPCT scan cell 400), the functional paths between scan cells of the CUT and such RPCT boundary scan cells at the primary output nodes can also be tested at-speed.

It should be noted that like the single-register designs discussed above, certain embodiments of the dual-register architecture use only one additional multiplexer in the boundary scan cell—specifically, on the serial output port. The remaining logic for clock and scan enable access can be added to the TAP controller in order to minimize routing and area overhead. The exemplary embodiments of the single-register and the dual-register designs are compliant with the IEEE 1149.1 standard while providing RPCT functionality.

Exemplary Bi-Directional Dual-Register RPCT Cell Designs

Figure 5:
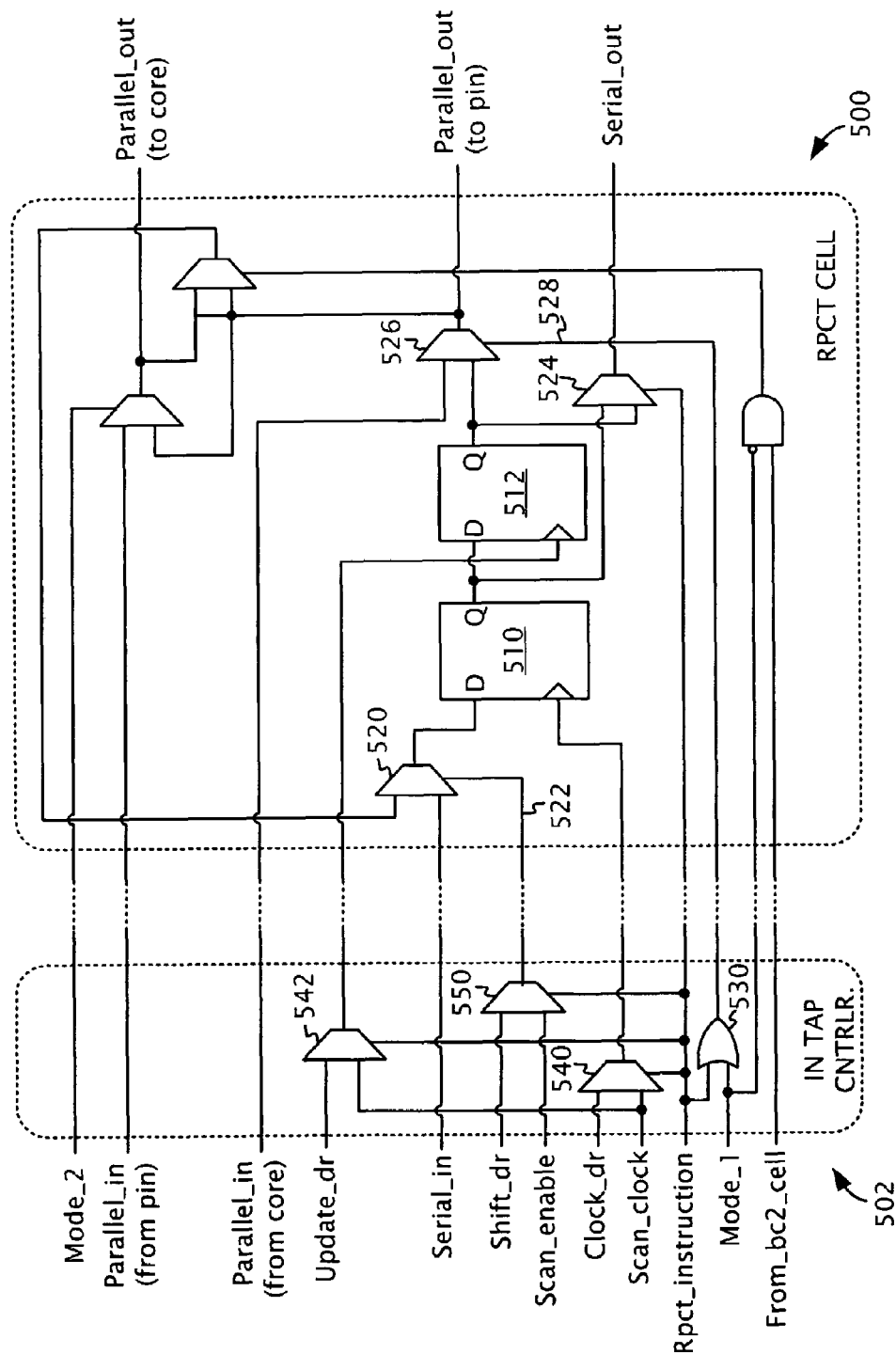
FIG. 5 is a schematic block diagram of a third RPCT boundary scan cell that can be used in embodiments of the disclosed RPCT architecture, such as the RPCT architectures of FIGS. 1, 3, and 6.

FIG. 5 shows an example bi-directional dual-register RPCT cell 500 based on the IEEE 1149.1 BC__7 cell, which is commonly used on bi-directional ports. Similar to the dual-register RPCT cell described above with respect to FIG. 4, the illustrated embodiment of the bi-directional dual-register RPCT cell 500 can be implemented by adding just a single multiplexer to the IEEE 1149.1 standard BC__7 cell in order to provide the RPCT functionality. As with the RPCT cell 400 described above, the example bi-directional dual-register RPCT cell 500 can be used to perform at-speed testing.

In comparison with a standard IEEE 1149.1 BC__7 cell, the exemplary bi-directional, dual-register cell 500 additionally includes a serial output multiplexer 524, which has an input coupled to the output of a first memory element 510 and an input coupled to the output of a second memory element 512. Thus, for example, during an RPCT mode (determined by the signal on the RPCT_instruction path), the cell 500 outputs data from the second memory element 512 on the serial output path (serial_out) instead of the data from the first memory element 510 (as when the cell 500 is not in the RPCT mode). Furthermore, when the cell 500 is operating in the RPCT mode, the parallel outputs provide output data from the second memory element 512 onto the parallel output paths (parallel_out_to_core and parallel_out_to_pin).

Furthermore, in the illustrated embodiment, the exemplary TAP controller 502 differs from a standard 1149.1 TAP controller in that it includes a first memory element clock multiplexer 540, a second memory element clock multiplexer 542, an input mode multiplexer 550, and a logic gate 530, all controlled by the signal on the RPCT_instruction path. Thus, for example, when the TAP controller 502 is operating in the RPCT mode, the clock signal routed to the first and second memory elements 510, 512 is the scan clock signal on the scan_clock path and the input selection signal 110 on the input selection path 522 is the scan-enable signal on the scan_enable path. Consequently, and in combination with the serial output multiplexer 524 routing the output of the second memory element 512 to the serial_out path, the bi-directional dual-register RPCT cell 500 behaves substantially as an internal scan cell having two sequentially coupled memory elements when operating in the RPCT mode.

As with the exemplary dual-register RPCT cell 400 described above with respect to FIG. 4, the exemplary bi-directional dual-register RPCT cell 500 can be used to apply at-speed test patterns to the functional logic of the CUT. Consequently, the functional pathways between a RPCT boundary scan cell 500 coupled to a primary input port and the first downstream scan cell or between a RPCT boundary scan cell 500 coupled to a primary output port and the first upstream scan cell can be tested at-speed.

Considerations for Applying Test Vectors

Typically, when a TAP controller (for example, a TAP controller according to the IEEE 1149.1 Standard) is used to test internal logic, the TAP controller's clock ("TCK") is used as the only capture clock during test pattern generation. The TAP controller's clock is typically used to help ensure that the TAP controller reaches predictable and valid states after the shift and capture operations. Because TCK is typically operated between 10 to 25 MHz, however, it is not ordinarily possible to use the TAP controller as an interface to test logic designs at their operational speed. Thus, at-speed testing is typically not possible in a standard IEEE 1149.1 environment.

In order to overcome the limitations of the TAP controller for at-speed testing and to facilitate RPCT, certain modifications can be implemented to the boundary scan cells in the boundary scan register and the TAP controller. For example, as exemplified above in FIGS. 2, 4, and 5, the boundary scan cells and TAP controller can be modified so that selected boundary scan cells (for example, at the primary inputs and primary outputs of the core logic) can be operated using the same test control signals used to control the internal scan chains. For example, the RPCT boundary scan cells can be operated substantially as internal scan cells by routing the scan enable signal and the scan clock signal to the RPCT boundary scan cells.

Furthermore, because many designs use multiple clock domains, the scan clocks controlling the RPCT boundary scan cells during testing should desirably correspond to the scan chain which it will likely launch to or capture data from. For example, any of the techniques or apparatus disclosed in U.S. Pat. No. 6,966,021, which is hereby incorporated herein by reference, can be used with embodiments of the disclosed technology. On the other hand, selecting the same clock for all boundary scan cells can facilitate a simpler implementation but may result in slightly less test coverage (for example, of the shadow logic on the primary inputs and output of the device). As illustrated above, embodiments of a dual-register RPCT boundary scan cell can be used to apply at-speed launch events and to capture the core logic response at-speed.

As illustrated in FIGS. 2, 4, and 5, the TAP controller is usually modified in order to provide the necessary instruction decode, scan enable and clock signals. For example, during the RPCT mode, the TAP controller can be placed into a single state (e.g., the Shift-DR state) and the standard TAP controller control signals for the boundary scan cells can be bypassed. As a result, the tester (or other hardware controlling the testing, such as on-chip test circuitry) can have control of the signals needed for shifting and capturing data into the boundary scan cells.

Further, because the RPCT boundary scan cells can be configured to effectively appear and operate as standard ATPG scan cells, any test pattern (including at-speed test patterns) can be applied without having to manipulate the TAP controller. For example, the TAP controller can remain in a constant state while the internal scan chains and the RPCT boundary scan cells are loaded and while the functional mode cycles are applied during testing. Further, any number of functional mode cycles can be applied during testing (that is, any number of clock pulses can be applied while the scan enable signal is deasserted). Thus, for example, a variety of different at-speed test patterns can be applied. For instance, one or more at-speed test patterns targeting path delays, bridging defects, undesirable capacitive couplings between circuit nodes resulting in cross-talk failures, and other such dynamic failures can be applied using embodiments of the disclosed technology. Further, test patterns that use two, three, four or more functional mode clock pulses during testing can be applied using embodiments of the disclosed architecture without having to change the state of the TAP controller. Static patterns can also be applied using embodiments of the disclosed technology.

Once an embodiment of the RPCT hardware is implemented, the application of scan patterns is simplified. Most ATPG tools can generate static and at-speed patterns for designs using embodiments of the disclosed RPCT boundary scan cells without any special provision. Certain considerations may, in some instances, need to be accounted for during the process of creating at-speed patterns for embodiments of the disclosed architectures because the architectures can impact how patterns are applied on a tester and what type of tester can apply the patterns. For high-performance nanometer designs, for example, at-speed testing can be important in identifying defective parts. However, many testers are unable to generate the fast clock pulses that mimic the performance of on-chip clock generators. In order to prevent good devices from being discarded due to an incorrect test failure, one can use on-chip clock generators to create the fast capture pulses while using the tester's slower clock to load and unload the scan chains. Because embodiments of the disclosed technology use the boundary scan cells and the internal scan cells to launch and capture at-speed events, the primary input and output pins are no longer valid launch and capture points. Thus, according to one exemplary embodiment, the primary inputs pins are held at a constant value during the capture cycle, while the primary output pins are not monitored for transition events. Further, when using embodiments of the dual-register RPCT cell design, the RPCT boundary scan cells can be used as launch and capture points, thereby providing at-speed testing of logic between the primary I/O and the first or last scan cell. As a result, a less-expensive tester can be used to achieve higher at-speed coverage.

Another consideration is whether to generate at-speed patterns using a launch-off-shift or broadside (two clock pulses in capture cycle) approach. In order to use launch-off-shift patterns, the scan enable signal is ordinarily routed and timed throughout the design as a clock signal, typically requiring more restrictions and area for a non-functional structure. Additionally, launch-off-shift patterns can load the scan cells with launch values that could never occur in functional mode, and thus result in artificially higher fault coverage results. Accordingly, in certain embodiments, the broadside test approach is used, resulting in less impact on the design and more accurate fault coverage results. The experimental results shown in the experimental results section below correspond to experiments using the broadside test approach.

RPCT and Test Data Compression Techniques

Figure 6:
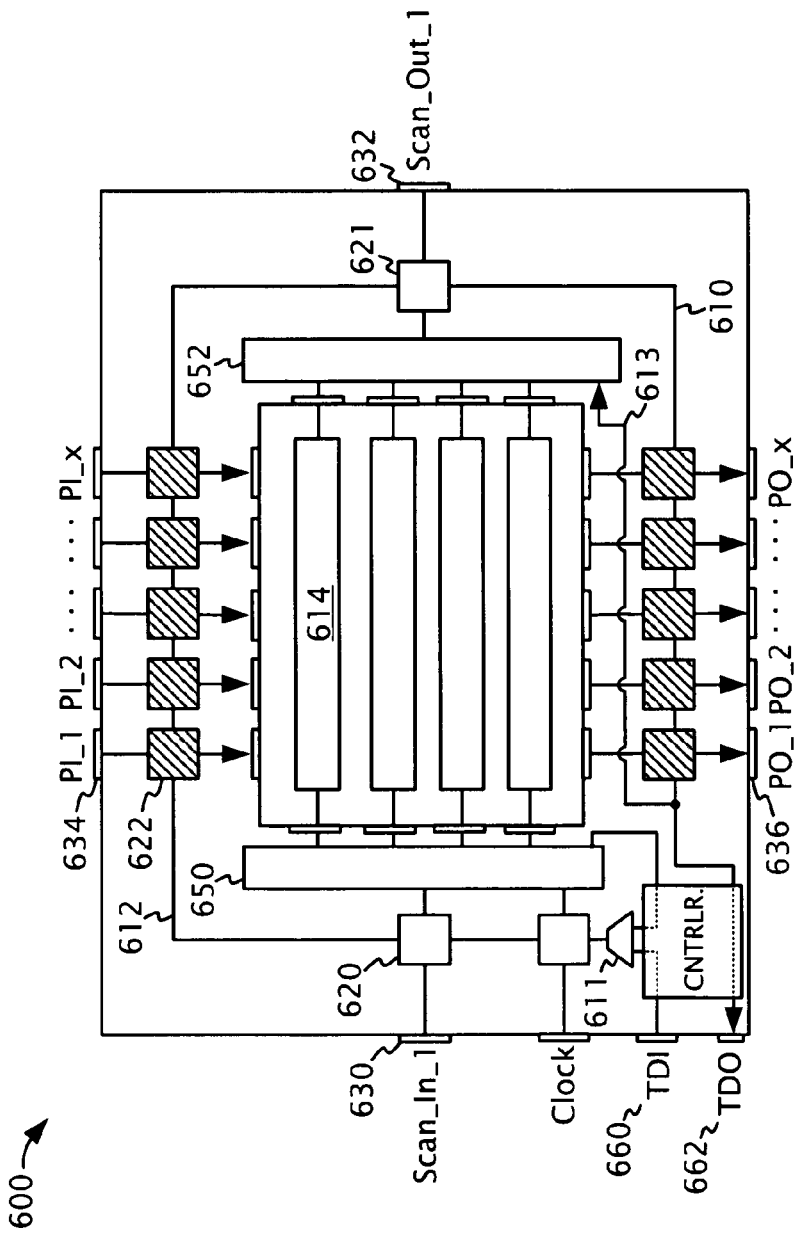
FIG. 6 is a schematic block diagram of another exemplary RPCT architecture that can use embodiments of the disclosed RPCT boundary scan cells. In the exemplary RPCT architecture of FIG. 6, test data is decompressed and compressed by on-chip compression hardware, further reducing the number of pins used to test the circuit-under-test.

The RPCT capabilities described here are fully compatible with scan compression techniques. Such schemes can be used, for instance, to further reduce the test costs. For example, many of the disclosed RPCT embodiments are compatible with Embedded Deterministic Test ("EDT"). See, e.g., Rajski J., Tyszer J. Kassab M., Mukherjee N., "Embedded Deterministic Test," *IEEE Trans. on CAD*, vol. 23, pgs. 776-792, which is hereby incorporated herein by reference. In EDT, standard long chains for ATPG are broken down into numerous short chains that are connected between a decompressor and a compactor. The boundary scan register ("BSR") can be treated as another scan chain or multiple chains if the BSR is sub-divided into multiple short chains. An example of such a configuration is shown in FIG. 6. In particular, FIG. 6 is a schematic block diagram of an exemplary RPCT architecture 600 comprising boundary scan cells 620, 621 (such as BC_1 cells) and RPCT boundary scan cells 622 (such as embodiments of the single-register boundary scan cell described above with respect to FIG. 2 or embodiments of the dual-register boundary scan cell described above with respect to FIGS. 4 and 5). The illustrated RPCT architecture 600 further comprises a scan-in pin 630 coupled to a decompressor 650 through the boundary scan cell 620. The decompressor 650 is configured to receive compressed test pattern data through the boundary scan cell 620, decompress the compressed test pattern data into decompressed test pattern data, and to apply the decompressed test pattern data to scan cells of the scan chains 614 in the circuit-under-test 610. In the illustrated embodiment, the decompressor 650 comprises an embodiment of an EDT decompressor, as described in Rajski J., Tyszer J. Kassab M., Mukherjee N., "Embedded Deterministic Test," *IEEE Trans. on CAD*, vol. 23, pgs. 776-792, or in U.S. Patent Application Publication No. 2003/0120988, which are hereby incorporated herein by reference. The illustrated RPCT architecture 600 further includes a scan-out pin 632 coupled to a compactor 652 through boundary scan cell 621. The compactor 652 receives test response data from the scan cells of the scan chains 614 of the CUT 610, compresses the test response data, and outputs the compressed data to the scan-output pin 632 through boundary scan cell 621. In the illustrated embodiment, the compactor 650 comprises an EDT compactor as described in Rajski J., Tyszer J. Kassab M., Mukherjee N., "Embedded Deterministic Test," *IEEE Trans. on CAD*, vol. 23, pgs. 776-792, or in U.S. Pat. No. 6,557,129, which are hereby incorporated herein by reference.

Using an embodiment such as that shown in FIG. 6, most or all scan chains 614 of the CUT 610 can be accessed through as few as one top-level scan channel, such as the scan-in pin 630 illustrated in FIG. 6. Although access to the decompressor and compactor is shown through single respective scan-in pins 630, 632 in FIG. 6, other embodiments use additional scan-in pins to access the decomprsesor and/or compactor. Further, the exemplary embodiment illustrated in FIG. 6 includes a multiplexer 611 configured to route decompressed test pattern data from an output of the decompressor 650 into the boundary scan register 612. Thus, in this embodiment, the test data input ("TDI") pin 660 can be bypassed during RPCT operation. Similarly, an output bypass path 613 can be used to load data from the boundary scan register 612 into an input of the compactor 652, thereby bypassing the test data output ("TDO") pin 662 during RPCT operation.

By using compression hardware (such as EDT compression hardware), the number of scan input and output pins at the top-level can be very small. The test patterns normally applied to the primary input pins 634 and primary output pins 636 of the architecture 600 can now be compressed as part of the scan patterns stored on the tester and loaded into the RPCT boundary scan cells 622 for test application. In such configurations, the compression hardware can provide desirable levels of compression of test data and reduced application time, and the use of one or more RPCT boundary scan cells can reduce or eliminate the need for access to the functional input and output pins. Using this technique on sub-block and/or core applications, large amounts of test data can be delivered to the core in very little time and with few connections to chip-level pins.

The particular configuration illustrated in FIG. 6 should not be construed as limiting, however, as other types of compression hardware can be used to implement the disclosed technology. For example, the illustrated RPCT architecture can be adapted for use with other decompressors, such as other linear finite state machine based decompressors. The illustrated RPCT architecture can also be adapted for use with other compactors, such as other spatial compactors (including, for example, error-correcting-code based compactors and the X-compactor), time compactors (including, for example, MISRs or MISR-like compactors), or finite memory compaction schemes (including, for example, the convolutional compactor). See, e.g., J. H. Patel, S. Lumetta, and S. M. Reddy, "Application of Saluja-Karpovsky Compactors to Test Responses with Many Unknowns," *Proc. IEEE VLSI Test Symp.*, pp. 107-112 (2003); Koenemann B., "A SmartBIST Variant with Guaranteed Encoding," *Proc. of ATS*, pp. 325-330 (2001); Mitra, S., et al., "X-Compact: An Efficient Response Compaction Technique, IEEE Trans. on Computer-Aided Design of Integrated Circuits and Systems, Vol, 23, no. 3 (March 2004); and U.S. Published Patent Application No. 2004/0230884, which is hereby incorporated herein by reference.

Experimental Results

The effectiveness of embodiments of the disclosed RPCT boundary scan cells was validated by simulating eleven small to medium sized benchmarks with embodiments of the disclosed RPCT architectures. The size of the circuits and the number of stuck-at faults are listed in Table 1 below. The experimental setup was as follows. Single-register RPCT boundary scan cells corresponding to the exemplary cells shown in FIG. 2 were used for all functional inputs and outputs in the netlists. There were no boundary scan cells added for the scan input and output pins, clock pins, scan enable pins, and test mode pins. For simplicity, a single boundary scan register was added to each design so that it could be accessed via TDI and TDO without the need for additional I/O pins.

TABLE 1

Benchmark Circuit Characteristics

| | | | ATE Interface Pins | | |
|---|---|---|---|---|---|
| | Gates | Faults | w/o RPCT | w/RPCT | % I/O Savings |
| $C_1$ | 8057 | 28422 | 169 | 17 | 89.94 |
| $C_2$ | 26109 | 95164 | 241 | 17 | 92.95 |
| $C_3$ | 29021 | 78810 | 225 | 32 | 85.78 |
| $C_4$ | 44702 | 153116 | 187 | 14 | 92.51 |
| $C_5$ | 79405 | 264040 | 1323 | 61 | 95.39 |
| $C_6$ | 82764 | 276072 | 310 | 17 | 92.52 |
| $C_7$ | 84883 | 189536 | 127 | 16 | 87.40 |
| $C_8$ | 91999 | 387960 | 128 | 25 | 80.47 |
| $C_9$ | 102806 | 260310 | 117 | 19 | 83.76 |
| $C_{10}$ | 122268 | 372382 | 605 | 18 | 97.02 |
| $C_{11}$ | 137741 | 246072 | 344 | 64 | 81.40 |

The fifth column in Table 1 ("% I/O Savings") shows the savings in the number of pins driven during structural testing. The savings in the number of pins driven by the ATE is proportional to the number of functional I/O pins and can be significant for large designs that usually have a very large number of I/O pins. As noted, the first set of experiments was performed using the single-register RPCT cell embodiment discussed above and illustrated in FIG. 2. In particular, the exemplary single-register RPCT cell of FIG. 2 was added for all the primary inputs and outputs of the netlist, and subsequently, compliance to the 1149.1 standard was verified. Note that the exemplary RPCT cell of FIG. 2 is based on a standard boundary scan cell (BC_1) that is available as part of a standard boundary scan cell library. Table 2 below presents the fault coverage and test patterns for the baseline core and the core with the exemplary RPCT cells added to it. As can be seen, the fault coverage with and without the RPCT cells is almost equivalent. The different fault coverage can be attributed to fortuitous detections due to difference circuit configurations seen by the ATPG tool.

TABLE 2

Single-Register RPCT Cell Architecture

| | Stuck-At Coverage | | # of Test Patterns | |
|---|---|---|---|---|
| | Core | RPCT | Core | RPCT |
| $C_1$ | 98.77 | 98.77 | 345 | 333 |
| $C_2$ | 96.92 | 96.93 | 348 | 303 |
| $C_3$ | 94.62 | 94.56 | 749 | 791 |
| $C_4$ | 96.79 | 96.79 | 510 | 509 |
| $C_5$ | 92.43 | 92.65 | 2146 | 2170 |
| $C_6$ | 97.11 | 96.75 | 1586 | 1442 |
| $C_7$ | 98.70 | 98.67 | 549 | 555 |
| $C_8$ | 98.53 | 98.51 | 268 | 265 |
| $C_9$ | 98.63 | 98.70 | 525 | 555 |
| $C_{10}$ | 95.74 | 95.74 | 2707 | 2713 |
| $C_{11}$ | 99.46 | 99.44 | 884 | 841 |

The second set of experiments was performed using the exemplary dual-register RPCT cell discussed above and illustrated in FIG. 4. As discussed above, the exemplary dual-register RPCT cell is suitable for both static and dynamic testing. In the experiments, test vectors were generated for both stuck-at and transition fault models, and the test coverage was compared with the baseline coverage for the core. Broadside capture sequences with a sequential depth of two were used. The ATPG tool was set up to allow multiple clock pulses during the capture cycle, since otherwise it may not be possible to detect faults at scan cells that are clocked by a different clock than those used for the boundary scan cells. In order to create patterns suitable for most testers, at-speed changes on the primary input pins during the capture cycle were prohibited. The results of these experiments are shown in Table 3.

TABLE 3

Dual-Register RPCT Cell Architecture

| | Stuck-At Coverage (# of test patterns.) | | Transition Coverage (# of test patterns.) | | |
|---|---|---|---|---|---|
| | Core | RPCT | Core | Core Hold-PI | RPCT |
| $C_1$ | 98.77 | 98.77 | 84.10 | 79.25 | 84.15 |
| | (345) | (341) | (1053) | (1035) | (1049) |
| $C_2$ | 96.92 | 96.96 | 87.55 | 74.98 | 85.10 |
| | (348) | (299) | (1103) | (936) | (891) |
| $C_3$ | 94.62 | 94.51 | 68.18 | 57.15 | 67.91 |
| | (749) | (758) | (1763) | (1582) | (1754) |
| $C_4$ | 96.79 | 96.79 | 89.61 | 86.78 | 89.56 |
| | (510) | (527) | (2457) | (2408) | (2458) |
| $C_5$ | 92.43 | 92.52 | 75.11 | 73.45 | 75.18 |
| | (2146) | (2157) | (4322) | (4308) | (4342) |
| $C_6$ | 97.11 | 96.75 | 88.61 | 60.41 | 86.55 |
| | (1586) | (1438) | (5806) | (2625) | (4736) |
| $C_7$ | 98.70 | 98.75 | 90.10 | 88.77 | 90.43 |
| | (549) | (570) | (1393) | (1579) | (1467) |
| $C_8$ | 98.53 | 98.53 | 80.24 | 71.89 | 79.91 |
| | (268) | (271) | (832) | (789) | (849) |
| $C_9$ | 98.63 | 98.60 | 89.39 | 88.52 | 91.29 |
| | (525) | (544) | (2259) | (2250) | (2253) |
| $C_{10}$ | 95.74 | 95.74 | 72.38 | 70.79 | 72.29 |
| | (2707) | (2683) | (4644) | (4698) | (4639) |
| $C_{11}$ | 99.46 | 99.41 | 96.46 | 44.96 | 96.07 |
| | (884) | (835) | (723) | (403) | (779) |

The first column of Table 3 shows the stuck-at fault coverage for the original core and the core with RPCT. The second column indicates the transition fault coverage for the two scenarios. The numbers in brackets indicate the test patterns needed to get the coverage presented in the table. As expected, the transition fault test coverage for designs using the exemplary dual-register RPCT cell design achieved higher coverage than those which had no at-speed controllability and observability of primary I/O pins. Moreover, the difference in coverage was directly related to the amount of combinational logic that a particular design had between the primary I/O and the first scan cell. For example, design $C_{11}$ contained a large amount of shadow logic (combinational logic between a primary I/O and an internal scan cell), which resulted in greater than twofold improvement in test coverage when the exemplary RPCT methodology was used.

Exemplary Computing Environments and Other Exemplary Embodiments

Figure 9:
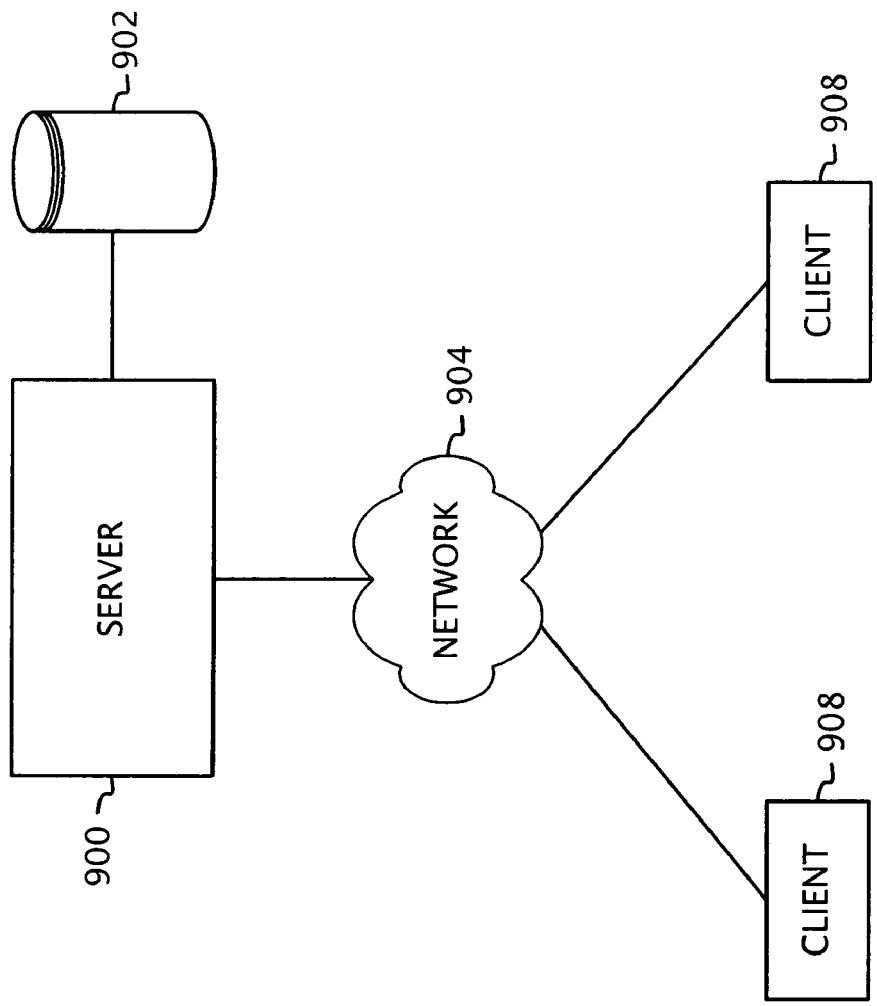
FIG. 9 is a block diagram showing an exemplary computer network as may be used to perform any of the disclosed methods.

Any of the aspects of the technology described above may be performed or designed using a distributed computer network. FIG. 9 shows one such exemplary network. A server computer 900 can have an associated storage device 902 (internal or external to the server computer). For example, the server computer 900 can be configured to design and implement boundary scan cells according to any of the embodiments described above (e.g., as part of an EDA software tool, such as a JTAG logic or boundary scan insertion tool). The server computer 900 may be coupled to a network, shown generally at 904, which can comprise, for example, a wide-area network, a local-area network, a client-server network, the Internet, or other such network. One or more client computers, such as those shown at 906, 908, may be coupled to the network 904 using a network protocol. The work may also be performed on a single, dedicated workstation, which has its own memory and one or more CPUs.

FIG. 10 shows that one or more databases or data structures containing design information (e.g., a netlist, HDL file, GDSII file, or Oasis file) may be updated to include design information for an RPCT architecture according to any of the embodiments disclosed herein using a remote server computer, such as the server computer 1000 shown in FIG. 10. In process block 1002, for example, the client computer sends design data relating to a circuit design for which a JTAG architecture is to be created. For instance, the client computer may send a netlist or other EDA design data structure or database. In process block 1004, the design data is received and loaded by the server computer. In process block 1006, the circuit defined by the design data is received and a corresponding RPCT boundary scan architecture according to any of the disclosed embodiments created. New design data representing the RPCT architecture can then be created. This new design data can be stored, for example, as an updated version of the design data structure or database or as one or more separate data structures or databases. In process block 1008, the server computer sends the RPCT boundary scan architecture data to the client computer, which receives the updated data in process block 1010. It should be apparent to those skilled in the art that the example shown in FIG. 10 is not the only way to update or create a design data structure or database having the relevant design data. For instance, the design data may be stored on a computer-readable medium that is not on a network and that is sent separately to the server (for example, on a portable hard drive or CD-ROM). Or, the server computer may perform only a portion of the design procedures.

Furthermore, the networked computing environments described above or a distributed computing environment can be used to perform test pattern generation for any of the disclosed RPCT architectures. Computer-readable media storing test patterns generated in such environments (or on a single computer) are also considered to be within the scope of this disclosure.

In addition to the embodiments claimed below, several other exemplary embodiments are disclosed herein. For example, one exemplary embodiment is a circuit that includes one or more boundary scan cells coupled to primary input ports or primary output ports of a circuit-under-test. The circuit further includes a boundary scan cell controller configured to apply test control signals to the one or more boundary scan cells. In this embodiment, the controller is configured to operate in a mode of operation whereby the controller applies test control signals to the one or more boundary scan cells that correspond to test control signals used to control one or more internal scan chains of the circuit-under-test during testing. In some embodiments, the mode of operation is a first mode of operation, the test control signals in this first mode of operation are generated outside of the boundary scan cell controller, and the controller is operable in a second mode of operation whereby test control signals generated by the controller are applied to the one or more boundary scan cells. The boundary scan cells can include, for instance, a boundary scan cell that behaves as a MUX-D scan cell having a single register in response to the test control signals or a boundary scan cell that is operable by the test control signals to serially load two test pattern values into two respective memory elements of the boundary scan cell and to sequentially output the test pattern values onto a parallel output path of the boundary scan cell. In certain implementations, the circuit further includes a decompressor configured to receive compressed test pattern data on one or more input pins, decompress the compressed test pattern into decompressed test pattern data, and output the decompressed test pattern data to the one or more boundary scan cells and to the one or more internal scan chains of the circuit-under-test. Certain implementations further include a compactor configured to receive test response data from the one or more boundary scan cells and from the one or more internal scan chains of the circuit-under-test, compress the test response data into compacted test response data, and output the compacted test response data on one or more output pins.

Another disclosed embodiment is an example of a so-called single-register boundary scan cell, which is generally less desirable than dual-register-type boundary scan cells for applying multi-cycle test patterns, such as at-speed test patterns. In this embodiment, the boundary scan cell comprises a first memory element and a second memory element having an input coupled to an output of the first memory element. The boundary scan cell further includes a multiplexing circuit having a first input coupled to a parallel input path of the boundary scan cell, a second input coupled the output of the first memory element, and a third input coupled to an output of the second memory element. The multiplexing circuit of this embodiment is configured to produce an output value on a parallel output path of the boundary scan cell in response to one or more selection signals, the output value being one of the value of the parallel input path, the value output from the first memory element, or the value output from the second memory element. The multiplexing circuit can comprise, for example, two two-to-one multiplexers, each controlled by a separate selection signal. In some implementations, the parallel output path of the boundary scan cell is coupled to a primary input port of the circuit-under-test. Further, in certain implementations, the parallel input path of the boundary scan is coupled to a primary output port of the circuit-under-test. The boundary scan cell of this embodiment can be controlled by a controller configured to apply test control signals used for controlling internal scan chains of the circuit-under-test to the boundary scan cell during a reduced-pin-count-testing mode of operation.

In another exemplary method, one or more test patterns are loaded into at least a first set of boundary scan cells coupled to primary input ports of a circuit-under-test and into internal scan chains of the circuit-under-test. The one or more test patterns are applied to functional logic of the circuit-under-test. One or more test responses to the test patterns are captured in at least some of the internal scan chains of the circuit-under-test. In certain implementations, the capturing of the one or more test responses further includes capturing at least a portion of the one or more test responses in a second set of boundary scan cells coupled to primary output ports of the circuit-under-test. Further, the one or more test patterns loaded and applied can comprise at least one at-speed test pattern. The act of loading an at-speed test pattern can include loading initialization values and transition values into respective boundary scan cells of the first set of boundary scan cells. In some implementations, the act of capturing is performed not later than one clock cycle of an operational clock after the one or more test patterns are applied to the functional logic. Further, in some implementations, the test patterns can be decompressed from compressed test pattern data, and the test responses can be compacted. In certain implementations, the loading of the first set of boundary scan cells and the internal scan chains is performed through a single test data input pin. In other implementations, the loading into the first set of boundary scan cells is performed through a serial input pin and the loading of the internal scan chains is performed through one or more parallel input pins.

Having illustrated and described the principles of the illustrated embodiments, it will be apparent to those skilled in the art that the embodiments can be modified in arrangement and detail without departing from such principles. For example, multiple single-register boundary scan cells can be coupled together (e.g., two or more boundary scan registers of single-register boundary scan cells coupled in parallel to one another) and used to apply multiple-cycle test patterns (e.g., at-speed test patterns). Further, many of the software aspects of the embodiments may be implemented in hardware, and many of the hardware aspects may be implemented in software. Also, many of the disclosed methods can be arranged in a different order to achieve the same end result. Those skilled in the art will recognize that the disclosed embodiments can be easily modified to accommodate different situations and structures.

In view of the many possible embodiments, it will be recognized that the illustrated embodiments include only examples and should not be taken as a limitation on the scope of the invention. Rather, the disclosed technology is defined by the following claims. We therefore claim all such embodiments and their equivalents that come within the scope of these claims.

What is claimed is:

1. A method for testing a circuit, comprising:

loading one or more test patterns into at least a first set of boundary scan cells coupled to primary input ports of a circuit-under-test and into internal scan chains of the circuit-under-test, wherein the act of loading includes serially shifting initialization values and transition values through two or more memory elements of a first boundary scan cell of the first set of boundary scan cells and into two or more memory elements of a second boundary scan cell of the first set of boundary scan cells;

applying the one or more test patterns to functional logic of the circuit-under-test, wherein the act of applying includes applying the transition values from the first set of boundary scan cells to the functional logic; and capturing one or more test responses to the one or more test patterns in at least some of the internal scan chains of the circuit-under-test.

2. The method of claim 1, wherein the act of capturing is performed substantially at-speed.

3. The method of claim 1, wherein the act of capturing further includes capturing at least a portion of the one or more test responses in a second set of boundary scan cells coupled to primary output ports of the circuit-under-test.

4. The method of claim 1, wherein the act of capturing is performed not later than one operational clock cycle after the one or more test patterns are applied to the functional logic, the operational clock cycle corresponding to an operational clock of the circuit-under-test.

5. The method of claim 1, wherein the applying and capturing acts are performed using a launch-off-shift test approach.

6. The method of claim 1, wherein the applying and capturing acts are performed using a broadside test approach.

7. The method of claim 1, further comprising,
decompressing the test patterns from compressed test pattern data; and
compacting the test responses.

8. The method of claim 1, wherein the loading of the first set of boundary scan cells and the internal scan chains is performed through a single test data input pin.

9. The method of claim 1, wherein the loading into the first set of boundary scan cells is performed through respective serial input pins and wherein the loading of the internal scan chains is performed through one or more respective parallel input pins.

10. An electronic device that includes an integrated circuit, comprising:

means for loading one or more test patterns into at least a first set of boundary scan cells coupled to primary input ports of a circuit-under-test and into internal scan chains of the circuit-under-test, the means for loading the one or more test patterns including means for serially shifting initialization values and transition values through two or more memory elements of a first boundary scan cell of the first set of boundary scan cells and into two or more memory elements of a second boundary scan cell of the first set of boundary scan cells;

means for applying the one or more test patterns to functional logic of the circuit-under-test, the means for applying the one or more test patterns including means for applying the transition values from the first set of boundary scan cells to the functional logic; and means for capturing one or more test responses to the test patterns in at least some of the internal scan chains of the circuit-under-test.

11. The device of claim 10, wherein the means for capturing the one or more test responses operates substantially at-speed.

12. The device of claim 10, wherein the means for capturing the one or more test responses includes means for capturing at least a portion of the one or more test responses in a second set of boundary scan cells coupled to primary output ports of the circuit-under-test.

13. A method for testing a circuit, comprising:

loading a first test pattern value into a first memory element of a boundary scan cell and a second test pattern value into a second memory element of the boundary scan cell, the second test pattern value being thereby output from the second memory element and applied to a path coupled to a serial output of the boundary scan cell and also applied through functional logic of the circuit to produce a response to the second test pattern value at one or more scan cells in the circuit;

clocking the second memory element to load the second memory element with the first test pattern value, the first test pattern value being thereby output from the second memory element and applied through the functional logic of the circuit to produce a response to the first test pattern value at the one or more scan cells in the circuit; and clocking the one or more scan cells in the circuit and thereby capturing the response to the first test pattern value in the one or more scan cells.

14. The method of claim 13, wherein the first test pattern value and the second test pattern value are test pattern values that create a transition at at least one of the one or more scan cells.

15. The method of claim 13, wherein the clocking of the one or more scan cells is performed so that the response is captured in a period of time not greater than one operating-frequency clock cycle from when the first test pattern value is launched into the functional logic from the second memory element.

16. The method of claim 13, wherein the clocking of the one or more scan cells is performed so that the response is captured in a period of time substantially equal to one operating-frequency clock cycle from when the first test pattern value is applied to the combinational logic from the second memory element.

17. The method of claim 13, wherein the clocking acts are performed using a launch-off-shift test approach or a broadside test approach.

18. The method of claim 13, wherein the clocking acts are performed using clock signals generated by a tester or on-chip circuitry configured to perform at-speed testing.

19. A circuit, comprising:

one or more boundary scan cells coupled to primary input ports or primary output ports of a circuit-under-test, each of the one or more boundary scan cells comprising two or more memory elements; and a boundary scan cell controller configured to apply test control signals to the one or more boundary scan cells, the boundary scan cell controller being configured to operate in a mode of operation whereby the boundary scan cell controller applies test control signals to the one or more boundary scan cells, the test control signals corresponding to test control signals used to control one or more internal scan chains of the circuit-under-test during testing and comprising an at-speed-clock signal, wherein the at-speed clock signal is generated outside of the boundary scan cell controller and wherein the boundary scan controller is capable of applying the at-speed-clock signal to each of the two or more memory elements in at least one of the boundary scan cells.

20. The circuit of claim 19, wherein the at-speed clock signal is generated by an external tester or by on-chip test circuitry configured to perform at-speed testing.

21. The circuit of claim 19, wherein the boundary scan cell controller is capable of remaining in a constant state while operating in the mode of operation.

22. The circuit of claim 19, wherein the one or more boundary scan cells include boundary scan cells that behave in response to the test control signals substantially as scan cells having a single register.

23. The circuit of claim 19, further comprising a decompressor configured to receive compressed test pattern data on one or more input pins, decompress the compressed test pattern into decompressed test pattern data, and output the decompressed test pattern data to the one or more boundary scan cells and to the one or more internal scan chains of the circuit-under-test.

24. The circuit of claim 19, further comprising a compactor configured to receive test response data from the one or more boundary scan cells and from the one or more internal scan chains of the circuit-under-test, compress the test response data into compacted test response data, and output the compacted test response data on one or more output pins.

25. A circuit, comprising:
one or more boundary scan cells coupled to primary input ports or primary output ports of a circuit-under-test; and
a boundary scan cell controller configured to apply test control signals to the one or more boundary scan cells,
the boundary scan cell controller being configured to operate in a mode of operation whereby the controller applies test control signals to the one or more boundary scan cells that correspond to test control signals used to control one or more internal scan chains of the circuit-under-test during testing and that include an at-speed-clock signal,
wherein the at-speed clock signal is generated outside of the boundary scan cell controller, and
wherein the one or more boundary scan cells include a boundary scan cell operable by the test control signals to serially load two test pattern values into two respective memory elements of the boundary scan cell and to sequentially output the test pattern values onto a parallel output path of the boundary scan cell.

26. The circuit of claim 25, wherein the at-speed clock signal is generated by an external tester or by on-chip test circuitry configured to perform at-speed testing.

27. The circuit of claim 25, wherein the boundary scan cell controller is capable of remaining in a constant state while operating in the mode of operation.

28. The circuit of claim 25, further comprising a decompressor configured to receive compressed test pattern data on one or more input pins, decompress the compressed test pattern into decompressed test pattern data, and output the decompressed test pattern data to the one or more boundary scan cells and to the one or more internal scan chains of the circuit-under-test.

29. The circuit of claim 25, further comprising a compactor configured to receive test response data from the one or more boundary scan cells and from the one or more internal scan chains of the circuit-under-test, compress the test response data into compacted test response data, and output the compacted test response data on one or more output pins.

30. One or more tangible computer-readable media storing computer-executable instructions, which when executed by a computer would cause the computer to simulate or generate design data for implementing a circuit, the circuit comprising:
one or more boundary scan cells coupled to primary input ports or primary output ports of a circuit-under-test, each of the one or more boundary scan cells comprising two or more memory elements; and
a boundary scan cell controller configured to apply test control signals to the one or more boundary scan cells,
the boundary scan cell controller being configured to operate in a mode of operation whereby the boundary scan cell controller applies test control signals to the one or more boundary scan cells, the test control signals corresponding to test control signals used to control one or more internal scan chains of the circuit-under-test during testing and comprising an at-speed-clock signal, wherein the at-speed clock signal is generated outside of the boundary scan cell controller and wherein the boundary scan controller is capable of applying the at-speed-clock signal to each of the two or more memory elements in at least one of the boundary scan cells.

31. The one or more tangible computer-readable media of claim 30, wherein the at-speed clock signal is generated by an external tester or by on-chip test circuitry configured to perform at-speed testing.

32. The one or more tangible computer-readable media of claim 30, wherein the boundary scan cell controller is capable of remaining in a constant state while operating in the mode of operation.

33. The one or more tangible computer-readable media of claim 30, wherein the circuit further comprises a decompressor configured to receive compressed test pattern data on one or more input pins, decompress the compressed test pattern into decompressed test pattern data, and output the decompressed test pattern data to the one or more boundary scan cells and to the one or more internal scan chains of the circuit-under-test.

34. The one or more tangible computer-readable media of claim 30, wherein the circuit further comprises a compactor configured to receive test response data from the one or more boundary scan cells and from the one or more internal scan chains of the circuit-under-test, compress the test response data into compacted test response data, and output the compacted test response data on one or more output pins.

35. The one or more tangible computer-readable media of claim 30, wherein the one or more boundary scan cells include a boundary scan cell operable by the test control signals to serially load two test pattern values into two respective memory elements of the boundary scan cell and to sequentially output the test pattern values onto a parallel output path of the boundary scan cell.

36. A boundary scan cell for use in testing a circuit-under-test, comprising:
a first memory element;
a second memory element having an input coupled to an output of the first memory element; and a multiplexing circuit having a first input coupled to the output of the first memory element and a second input coupled to an output of the second memory element, the multiplexing circuit being configured to produce an output value on a serial output path of the boundary scan cell in response to one or more selection signals, the output value being one of the value output from the first memory element or the value output from the second memory element.

37. The boundary scan cell of claim 36, wherein a parallel output path of the boundary scan cell is coupled to a primary input port of the circuit-under-test.

38. The boundary scan cell of claim 36, wherein a parallel input path of the boundary scan is coupled to a primary output port of the circuit-under-test.

39. The boundary scan cell of claim 36, wherein the multiplexing circuit comprises a two-to-one multiplexer.

40. The boundary scan cell of claim 36, wherein the boundary scan cell is controlled by a controller configured to apply test control signals used for controlling internal scan chains of the circuit-under-test to the boundary scan cells during a reduced-pin-count-testing mode of operation.

41. The boundary scan cell of claim 36, wherein the boundary scan cell is a bidirectional boundary scan cell.

42. One or more tangible computer-readable media storing computer-executable instructions, which when executed by a computer, would cause the computer to simulate or generate design data for implementing a circuit, the circuit comprising:

a first memory element;

a second memory element having an input coupled to an output of the first memory element; and a multiplexing circuit having a first input coupled to the output of the first memory element and a second input coupled to an output of the second memory element, the multiplexing circuit being configured to produce an output value on a serial output path of the boundary scan cell in response to one or more selection signals, the output value being one of the value output from the first memory element or the value output from the second memory element.

43. The one or more tangible computer-readable media of claim 42, wherein a parallel output path of the boundary scan cell is coupled to a primary input port of the circuit-under-test.

44. The one or more tangible computer-readable media of claim 42, wherein a parallel input path of the boundary scan is coupled to a primary output port of the circuit-under-test.

45. The one or more tangible computer-readable media of claim 42, wherein the multiplexing circuit comprises a two-to-one multiplexer.

46. The one or more tangible computer-readable media of claim 42, wherein the boundary scan cell is controlled by a controller that is capable of remaining in a constant state during a reduced-pin-count-testing mode of operation.

47. The one or more tangible computer-readable media of claim 42, wherein the boundary scan cell is a bidirectional boundary scan cell.

* * * * *